(12) United States Patent
Uchida

(10) Patent No.: US 6,897,430 B2
(45) Date of Patent: May 24, 2005

(54) SEMICONDUCTOR DEVICE, OPTOELECTRONIC BOARD, AND PRODUCTION METHODS THEREFOR

(75) Inventor: Mamoru Uchida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 10/025,928

(22) Filed: Dec. 26, 2001

(65) Prior Publication Data

US 2002/0109074 A1 Aug. 15, 2002

(30) Foreign Application Priority Data

Dec. 28, 2000 (JP) ........................................ 2000-400966
Dec. 13, 2001 (JP) ........................................ 2001-379831

(51) Int. Cl.[7] ............................................. H01L 31/00
(52) U.S. Cl. ..................... 250/214.1; 257/432; 257/184
(58) Field of Search ...................... 250/227.11, 214 R, 250/227.28–227.32, 359.1, 208.1, 214.1; 257/184–189, 80–82, 98–100, 432–434, 466, 680; 385/14, 27, 39–42, 18, 49–50; 356/337–338; 359/127, 154, 298–299

(56) References Cited

U.S. PATENT DOCUMENTS

| | | | | |
|---|---|---|---|---|
| 5,191,219 A | | 3/1993 | Linke ......................... 250/551 |
| 5,712,504 A | * | 1/1998 | Yano et al. .................. 257/452 |
| 5,737,458 A | | 4/1998 | Wojnarowski et al. ........ 385/15 |
| 5,757,989 A | | 5/1998 | Yoshimura et al. ........... 385/14 |
| 5,835,646 A | | 11/1998 | Yoshimura et al. ........... 385/14 |
| 5,955,776 A | | 9/1999 | Ishikawa .................... 267/618 |
| 6,097,472 A | | 8/2000 | Tanaka et al. ................ 355/47 |
| 6,343,171 B1 | * | 1/2002 | Yoshimura et al. ........... 385/50 |
| 6,499,889 B1 | * | 12/2002 | Shirakawa et al. ........... 385/88 |
| 6,516,104 B1 | * | 2/2003 | Furuyama .................... 385/14 |
| 2001/0032984 A1 | | 10/2001 | Uchida ........................ 274/84 |
| 2002/0167013 A1 | | 11/2002 | Iwasaki et al. ............... 257/79 |

FOREIGN PATENT DOCUMENTS

| | | |
|---|---|---|
| EP | 0 974 913 A1 | 1/2000 |
| EP | 1 139 122 A2 | 10/2001 |
| JP | 58-225746 | 12/1983 |
| JP | 59-75656 | 4/1984 |

(Continued)

OTHER PUBLICATIONS

"GaN FETs For Microwave and High-temperature Applications", Steven C. Binari, K. Doverspike, G. Elner, H.B. Dietrich and A.E. Wickenden. Naval Research Laboratory, Washington, DC 20375–5320 USA.
"High-temperature Reliability of GaN Metal Semiconductor Field–Effect Transistor and Bipolar Junction Transistor" Seikoh Yoshida and Joe Suzuki, Yokohama R&D Laboratories, The Furukawa Electric Co., Ltd. 2–4–3, OKano, Nishi-Ku, Yokohama, 220 Japan.
L. Balliet, et al., "Optical Transmission System for the Interconnecting Electronic Units", IBM Technical Disclosure Bulletin, vol. 26, No. 4, Sep. 1983, pp. 1793–1796.
"Ball Semiconductor Achieves Experimental Breakthrough for Building Electronic Devices Sphere", PR Newswire Page, Jun. 25, 1998, XP–002934951, pp. 1–3.

*Primary Examiner*—David Porta
*Assistant Examiner*—Patrick J. Lee
(74) *Attorney, Agent, or Firm*—Fitzpatrick, Cella, Harper and Scinto

(57) ABSTRACT

The semiconductor device of the present invention comprises an optical transmission region, and a light receiving part for converting light propagating through the optical transmission region to an electrical signal, wherein the optical transmission region comprises a two-dimensional optical waveguide layer, and wherein at least a portion of the light receiving part is embedded in the optical transmission region, whereby the present invention can provide a semiconductor device having reduced direction dependency when light propagating through the optical transmission region is received.

23 Claims, 20 Drawing Sheets

FOREIGN PATENT DOCUMENTS

| | | | |
|---|---|---|---|
| JP | 61-28240 | | 2/1986 |
| JP | 61028240 | * | 2/1986 |
| JP | 8-220357 | | 8/1996 |
| JP | 9-96746 | | 4/1997 |
| JP | 9-270751 | | 10/1997 |
| JP | 10-294254 | | 11/1998 |
| JP | 11-54406 | | 2/1999 |
| JP | 11-72750 | | 3/1999 |
| JP | 11-111609 | | 4/1999 |
| JP | 11-196069 | | 7/1999 |
| JP | 2000-31189 | | 1/2000 |
| JP | 2000-31190 | | 1/2000 |
| JP | 2000-235127 | | 8/2000 |
| JP | 2000-337872 | | 12/2000 |
| JP | 2001-280973 | | 10/2001 |
| JP | 2001-284635 | | 10/2001 |

* cited by examiner

SEMICONDUCTOR DEVICE, OPTOELECTRONIC BOARD, AND PRODUCTION METHODS THEREFOR

BACKGROUND OF THE INVENTION

1. Field of the Invention

The present invention relates to a semiconductor device in which an optical transmission medium and a light-receiving element carrying out photoelectric conversion are mixed and mounted, and more particularly, to an optoelectronic device comprising a two-dimensional optical waveguide as an optical transmission medium. The present invention further relates to an optoelectronic wiring substrate comprising an electric wiring layer and an optical transmission layer. Furthermore, the present invention relates to a spherical device.

2. Related Background Art

For cellular phones and personal digital assistants (PDA) which are spreading at a remarkable pace in recent years, there are demands that these devices be smaller, lighter and provided with transistors capable of extremely high-speed processing.

It has been pointed out that as the processing speed of transistors increases, or as the clock frequency of the CPU increases, the influence of transmission delay in the electronic circuit substrate also increases. Since the transmission delay is proportional to a product of a wiring resistance by a wiring capacitance, it is necessary to reduce the wiring resistance or the wiring capacitance. The simplest way to prevent the transmission delay is to minimize a wiring distance within each chip or between chips.

On the other hand, the processing speed is expected to improve as the wiring distance becomes shorter, but another problem becomes apparent. That is the problem of EMI (ElectroMagnetic Interference). Since electronic parts are placed closer to each other, a wiring distance becomes shorter but a wiring density becomes higher. As a result, when high-speed signals flow through adjacent signal lines, mutual electromagnetic induction causes electromagnetic waves to interfere with each other and generate noise, making it impossible to transmit signals correctly.

There are an increasing number of cases where in particular mobile terminals are driven with a larger current than conventional ones under the influence of proceeding devices operation at a lower voltage, thereby raising concern that influences of EMI becomes larger.

A method of using an optical wiring having an inherent advantage of causing no electromagnetic induction is proposed to solve the EMI problem.

For example, Japanese Patent Application Laid-Open No. 2000-235127 discloses a circuit substrate integrating an electronic element and an optical element as shown in FIG. 35. In FIG. 35, reference numeral 5201 denotes an electronic integrated circuit substrate; 5204, a light emitting part; 5206, a light receiving part; 5207, an optical path change section; 5210, a contact electrode. Reference numeral 5211 denotes polyimide to bond the circuit substrate 5201 and the light emitting part or light receiving part. Reference numeral 5212 denotes an electric wiring; 5213, plane light emitting laser; 5214, a photodiode; 5215, a low reflection film; 5216, a polymer layer; 5217, a first clad layer; 5218, a core layer; 5219, a second clad layer; 5220, a high reflection film.

The light emitted from the light emitting part 5213 is reflected by the optical path change section, propagates through the core layer 5218 in the direction indicated by an arrow 5221 in FIG. 35, the light path is changed again and the light is received by the light receiving part 5206. When the propagation direction of the incident light is predetermined, it is possible to replace a part of the electric signal wiring in the configuration shown in the above-described FIG. 35 with an optical wiring.

However, when the incident light that propagates through the core layer 5218 is the light from the direction 5222 indicated by the arrow in FIG. 35, it is impossible for the configuration shown in FIG. 35 to receive the light.

SUMMARY OF THE INVENTION

Therefore, it is an object of the present invention to provide a semiconductor device with reduced direction dependency when light propagating through the optical transmission region is received. It is another object of the present invention to provide a light emitting device or light receiving device capable of contributing to reduction of direction dependency (directivity).

The optoelectronic device according to the present invention is an optoelectronic device comprising an optical transmission region and a light receiving part that converts the light propagating through the light receiving part to an electric signal, wherein the optical transmission region includes a two-dimensional optical waveguide layer, and wherein at least a portion of the light receiving part is embedded in the optical transmission region.

The present invention can reduce direction dependency of light receiving sensitivity when the light propagating through the optical transmission region is received.

The present invention also allows the electric wiring layer to be stacked on the optical transmission layer region. The electric wiring layer can also be stacked on the entire surface of the optical transmission region. Of course, a semiconductor chip including electric wiring can also be stacked. In that case, the above-described light receiving part is interposed between the semiconductor chip and optical transmission region. In the case where the light receiving part has a pn junction region in pn structure or a pi or in junction region in pin structure, at least a part of the junction region is preferably embedded in the optical transmission region. Of course, substantially all of the junction region may be embedded in the optical transmission region.

The above-described light receiving part may also be embedded in the above-described optical transmission region so that the light propagating through the two-dimensional optical waveguide layer can be received directly.

The above-described light receiving part may also be embedded so that the light propagating through the two-dimensional optical waveguide layer can be substantially received without directivity.

It is preferred that the portion of the above-described receiving part embedded in the above-described optical transmission region have a spherical surface.

The above-described light receiving part may also include a spherical device. A portion of the light emitting part for transmitting light to the above-described optical transmission region may also be embedded in the above-described optical transmission region.

It is also preferred that the above-described optical transmission region is interposed between the electric wiring layer located on the above-described optical transmission region and another electric wiring layer located under the above-described optical transmission region, and at least portions of both electric wiring layers be electrically connected through a via hole that penetrates the above-described optical transmission region.

It is also possible to perform at least one of O/E conversion and E/O conversion between the electronic device provided on the above-described electric wiring layer and the above-described optical transmission region by using the spherical device.

Furthermore, the optoelectronic board according to the present invention is a substrate in which an electronic device and an optical device are arranged, comprising at least two layers consisting of the first layer and the second layer, wherein the above-described electronic device, the above-described optical device and an electric wiring that couples these two devices formed in the first layer of the substrate, and a two-dimensional optical waveguide is formed in the second layer of the substrate, wherein the above-described optical device includes a light receiving part that receives optical waveguided through the above-described two-dimensional optical waveguide, and wherein at least a portion of the above-described light receiving part is embedded in the above-described two-dimensional optical waveguide.

The above-described two-dimensional optical waveguide can also have a sheet form. The above-described light receiving part may have a spherical structure, be mounted from the surface of the above-described substrate so that the light receiving part is embedded in the above-described optical waveguide and coupled with the above-described electric wiring on the surface of the above-described substrate.

The above-described optical device may also include a light receiving part and an electric circuit that drives the optical device or amplifies an electric signal obtained.

The light source of the above-described optical device may have a spherical shape, be mounted from the surface of the above-described substrate so that the light source is embedded in the above-described optical waveguide of the above-described substrate and coupled with the above-described electric wiring on the surface of the above-described substrate.

The above-described substrate may also include a spherical-structured transmission device for transmission and a parallel signal line, the output terminal of the parallel signal line may be coupled with the above-described spherical transmission device, and parallel/serial conversion may be conducted by the above-described transmission device and a serial optical signal can be sent to the above-described two-dimensional optical waveguide.

The optoelectronic board according to the present invention can also be characterized in that the above-described serial optical signal is received by the above-described light receiving part embedded in the above-described optical waveguide, converted to an electric signal, serial/parallel-converted by an electronic circuit simultaneously formed on the light receiving part and transmitted to the above-described parallel signal line.

The above-described optoelectronic board may also be constructed with a flexible substrate material (flexible sheet).

The optoelectronic integrated circuit according to the present invention is an optoelectronic integrated circuit which integrates an electronic device and an optical device on the surface of a spherical semiconductor substrate, characterized in that the above-described optical device is a light receiving element including a multi-layered film containing a pn junction in the radial direction of the spherical semiconductor substrate, and the above-described electronic device has at least a bias circuit that applies a reverse bias to the above-described light receiving element and an amplifier that amplifies light received and converted to an electric signal.

The optoelectronic integrated circuit according to the present invention integrates an electronic device and an optical device on the surface of a spherical semiconductor substrate and is characterized in that the above-described optical device is a light receiving element including a multi-layered film containing a pn junction in the radial direction of the spherical semiconductor substrate, and the above-described electronic device includes a bias circuit that applies a forward bias to the above-described light emitting element.

The optoelectronic integrated circuit according to the present invention integrates an electronic device and an optical device on the surface of a spherical semiconductor substrate and is characterized in that the above-described optical device is formed by flatting a portion of the surface of the above-described spherical semiconductor, exposing a plurality of small planes and then stacking a multi-layered film containing a pn junction in the radial direction of the spherical semiconductor substrate on the above-described small planes, and the above-described electronic device has at least a bias circuit that applies a reverse bias or a forward bias thereto.

In the steps of flattening a portion of the surface of the above-described spherical semiconductor substrate, exposing a plurality of small planes and stacking a multi-layered film containing a pn junction in the radial direction of the spherical semiconductor substrate on the above-described small planes, it is also possible to cover a region other than small planes of the surface of the spherical semiconductor substrate with a dielectric film, etc. and selectively stack the multi-layer film containing the pn junction only on the small planes by organic metal epitaxial growth or gas source molecular beam vapor deposition.

The small planes that constitute the flattened portion of the above-described spherical semiconductor surface may also consist of crystalline planes, which are equivalent to one another in terms of crystal engineerings or chemically similar to one another.

DETAILED DESCRIPTION OF THE PREFERRED EMBODIMENTS

An embodiment of the present invention will be explained using FIG. 1 below.

Figure 1:
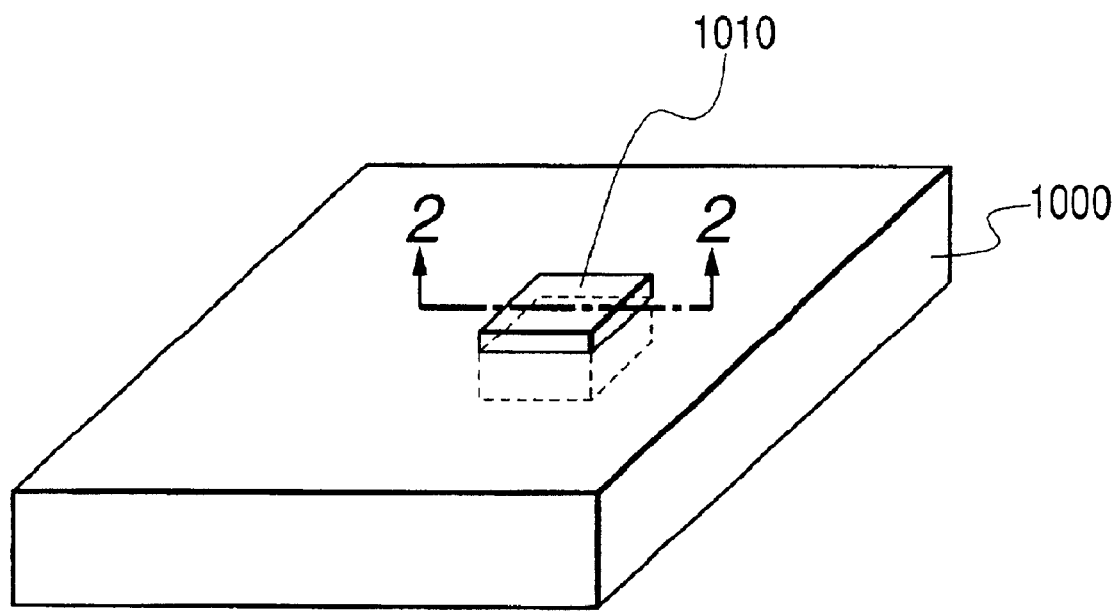
FIG. 1 is a schematic perspective view illustrating an embodiment of the present invention.

In FIG. 1, reference numeral 1000 denotes an optical transmission region including a two-dimensional optical waveguide layer, and 1010 denotes a light receiving part that receives light propagating through the optical transmission region. A sectional view taken in the line 2—2 of FIG. 1 is shown in FIG. 2.

Figure 2:
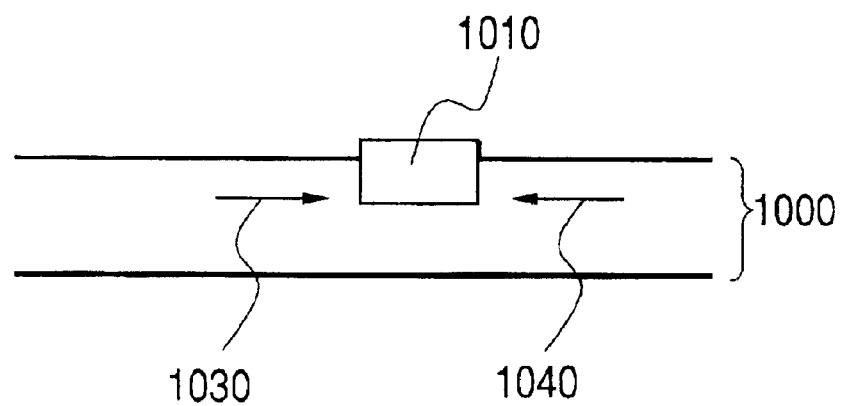
FIG. 2 is a schematic sectional view illustrating an embodiment of the present invention.

As shown in FIG. 2, by embedding at least a portion of the light receiving part 1010 in the optical transmission region 1000, it is possible to provide a semiconductor device having reduced direction dependency of light propagating through the optical transmission region that can be received by the light receiving part.

In FIG. 2. reference numerals 1030 and 1040 show a state that propagating light is received by the light receiving part 1010.

The optical transmission region is formed of, for example, a core layer inserted between clad layers of a refraction factor lower than that of the core layer. As the material of the core layer, optical resin such as PMMA, polymethyl methacrylate, silica-based glass and plastic material such as polystyrene and polycarbonate, etc. The material of the clad layer is not particularly limited if it has at least a refraction factor lower than that of the core layer. For example, a polymer containing fluorine, PCZ and Arton (manufactured by JSR Company) can be used.

Unlike a linear optical waveguide which presets the direction of light propagation to a single direction, the two-dimensional optical waveguide layer means a planar optical waveguide capable of propagating light in a plurality of directions within the plane. In the present invention, the two-dimensional optical waveguide layer is also sometimes referred to as "optical sheet". The light receiving part is a photoelectric conversion device capable of performing O/E conversion. A pn type or pin type photodiode can be used. The pn junction plane can be either parallel to the optical sheet or almost perpendicular to the optical sheet. It is particularly preferred that the shape of the part embedded in the optical transmission region of the light receiving part be polyhedral or spherical.

When the light receiving part is embedded in the optical transmission region, either a portion or substantially the whole of the light receiving part can be embedded. It is preferred that the pn junction section be embedded at least in the core layer.

When the optical transmission region includes the core layer and clad layer, it is preferred that the light receiving part be embedded to such a depth that it reaches the core layer.

It is also possible to form an electrical wiring region on the two-dimensional optical waveguide layer which is the optical transmission region. Its example is shown in FIG. 3.

Figure 3:
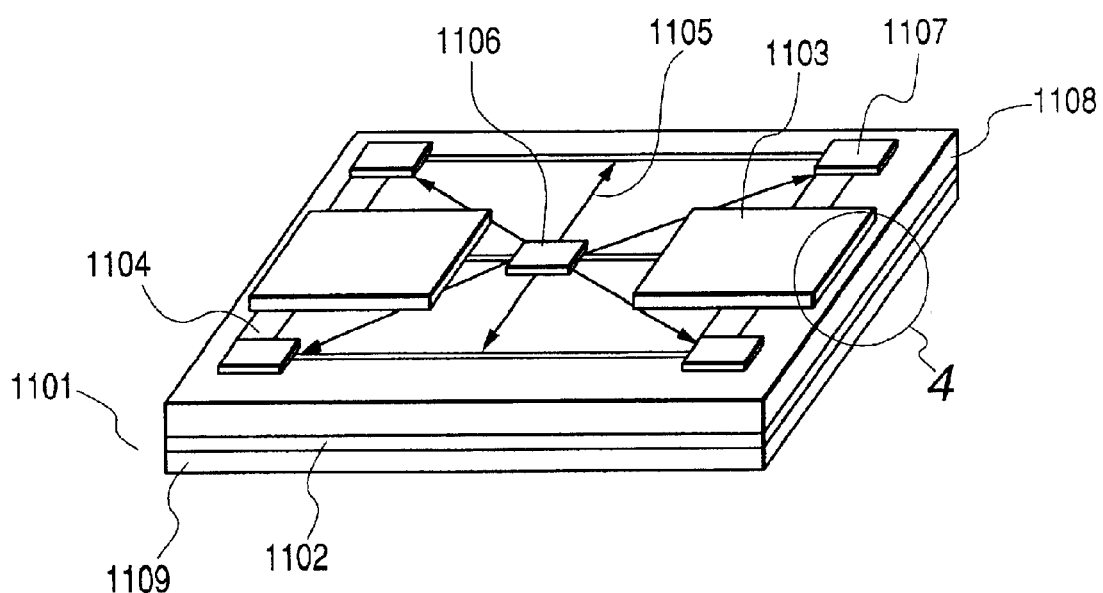
FIG. 3 is a perspective view illustrating the present invention.

In FIG. 3, reference numeral 1101 denotes an optoelectronic board; 1102, a two-dimensional optical waveguide layer (hereinafter referred to as "optical sheet") formed therein. Reference numerals 1103 and 1106 denote electronic devices formed on an electric wiring region 1108 (e.g., CPU, RAM, RF oscillator); 1104, electric wiring formed on the surface; 1105 indicated by an arrow in FIG. 3, optical wiring formed by light that propagates through the above-described optical sheet. Reference numeral 1109 denotes a support substrate. The support substrate, of course, can be provided as required. Or the support substrate itself can function as a clad layer.

FIG. 3 shows a state that a signal is transmitted from the electronic device 1106 to another electronic device 1107, etc. by using the optical sheet.

For example, when wiring from the electronic device 1106 to 1107 is performed by means of optical wiring, an electric signal from the electronic device 1106 is converted to an optical signal by an E/O conversion section (not shown) and this optical signal is spread over the optical sheet 1102. The optical signal propagates in a radial pattern and in all directions, but it is also possible to allow the optical sheet to have a function so that the optical signal mainly propagates in a specific direction.

The optical signal that propagates through the optical sheet is received by the electronic device 1107 via an O/E conversion section (not shown). Optical wiring is realized in this way.

Furthermore, since the two-dimensional optical waveguide layer is used, even if the electronic device 1107 does not exist in an initial circuit pattern, the electronic device 1107 can be placed at any position of the electric wiring region 1108 (e.g., FIG. 1). Though it can be placed at any position, of course, an empty region is necessary to place the electronic device 1107. Use of optical wiring can reduce influences of EMI and since at least a portion of the light receiving part is embedded in the optical waveguide, it is possible to receive signal lights from various directions.

Figure 4:
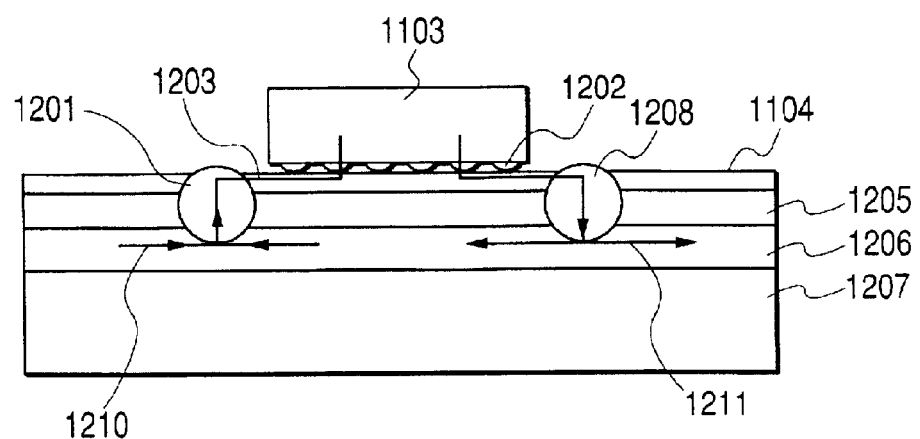
FIG. 4 is a schematic sectional view illustrating the present invention.

Furthermore, it is further preferred that at least a portion of the light emitting part which sends signal light to the optical sheet be embedded in the optical sheet. Its example is shown in FIG. 4. FIG. 4 describes a case where an electronic device is mounted as a flip chip. Reference numeral 1103 denotes the electronic device; 1104, a metal wiring region; 1201, a light receiving part; 1202, a metal bump; 1205, an upper clad layer; 1206, a core layer; 1207, a lower clad layer; 1208, a light emitting part. Reference numeral 1210 shows a state that propagating light is received by the light receiving part 1201. Reference numeral 1203 shows a state that an electric signal obtained by O/E-converting the light received by the light receiving part is transmitted to the electronic device. Reference numeral 1211 shows a state that light propagating from the light emitting part 1208 through the core layer 1206 is transmitted.

In FIG. 4, since a portion of the light emitting part 1208 is embedded in the core layer 1206 and a spherical device (will be described in detail later) is used, light propagates in such a way that it spreads in directions within the plane in the core layer.

A ball IC is produced, for example, as follows:

(1) First, an Si sphere is made. Granular polycrystalline Si is melted inside a pipe with a diameter of 2 mm to form a quasi-spherical single crystal. After this, surface polishing is applied in a procedure similar to that for producing a ball bearing to make a complete sphere of 1 mm.

(2) Then, the sphere is passed through an IC process pipe and subjected to oxidation and diffusion processes. Pattern printing can be provided using a method disclosed, for example, in Japanese Patent Application Laid-Open No. 10-294254 and Japanese Patent Application Laid-Open No. 11-54406. According to the former, a circuit pattern corresponding to the spherical surface of the Si sphere material is provided, the circuit pattern is exposed over a region more than half of the total spherical surface all at once. In the latter, an axis passing through the center of the spherical IC is determined arbitrarily, the spherical IC is rotated around the axis intermittently, the exposure region of the surface of the spherical IC corresponding to this rotation angle is exposed using a mask corresponding thereto. An Si ball IC is completed in these steps. When light is emitted from or entered into the two-dimensional optical waveguide effectively, it is also possible to additionally use a mirror, prism, grating or hologram, etc.

The spherical semiconductor material used for the present invention can include Si, GaAs, InP, GaN, SiGe, GaAsN, Ge, AlN, etc. Of course, it is preferred that these materials be single crystals, but if these materials serve as the light receiving part or light emitting part sufficiently, these materials may be polycrystalline or amorphous. The multi-layer film for forming the above-described light receiving element or light emitting element can be composed of, for example, p-Si/i-Si/n-Si, p-GaAs/GaAsN/n-GaAs or p-(Al, Ga) (As, P, N)/i-(Al, Ga)(As, P, N)/n-(Al, Ga)(As, P, N) layers. Here, with respect to an expression "(A, B)(C, D, E)", A and B means elements belonging to the Group III of the Periodic Table, and C, D and E means elements belonging to the Group V of the Periodic Table. Accordingly, the expression "(A, B)(C, D, E)" means "$A_xB_{1-x}C_yD_zE_{1-y-z}$".

Embodiment 1: Optical Sheet+Spherical Light Receiving Device

A first embodiment will be explained using FIG. 1, FIG. 2, FIG. 5 and FIG. 6. As the core layer of the optical transmission medium 1000, optical resin PMMA was used. As the clad layers between which the core layer is inserted, polyimide was used. The thickness of the entire optical transmission medium was approximately 0.8 mm (the core layer: 0.2 mm; the clad layer: 0.3 mm×2), the size is 30×30 mm. The specific method of manufacturing the optical transmission medium will be described later.

Figure 5:
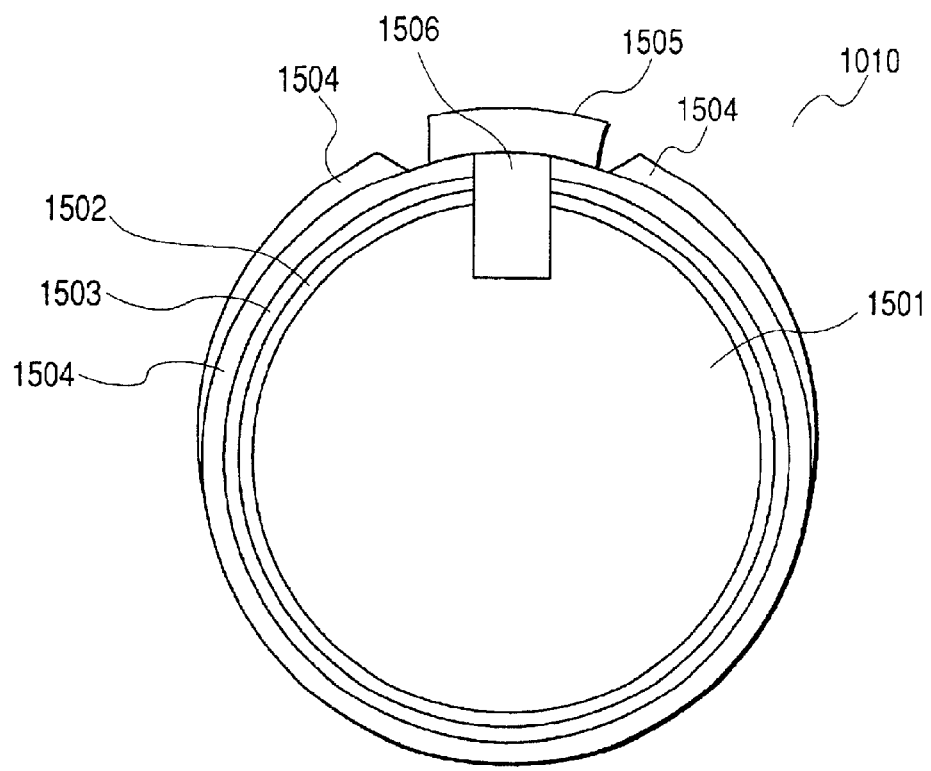
FIG. 5 is a schematic sectional view illustrating a spherical optical device.

As the light receiving part 1010, a spherical device can be used. FIG. 5 shows a schematic sectional view of the spherical device. In FIG. 5, reference numeral 1501 denotes a spherical p-type Si member. The Si sphere itself is obtained, for example, by melting granular polycrystalline Si, transforming it into a quasi-spherical single crystal, applying surface polishing to make a complete sphere using a procedure for making a ball bearing. On the spherical Si member 1501, p-type AlGaAsN is allowed to grow as a first clad layer 1502, undoped GaAsN as an active layer 1503, and n-type AlGaAsN as a second clad layer 1504. A GaAsN-based compound semiconductor is used here because its band gap is smaller than that of GaAs and it has an excellent temperature characteristic and facilitates lattice matching.

Of course, instead of allowing a compound semiconductor thin film to grow on the spherical Si, it is also possible to allow an n-type silicon thin film to grow on the surface of p-type spherical silicon and form a pn junction to produce a light receiving part (photodiode). Moreover, it is also possible to use an ion implantation method or diffusion method (thermo-diffusion or solid phase diffusion) instead of producing a pn junction by means of growth of a thin film.

At an electrode section of this ball IC, a cathode 1504 and an anode 1505 are formed, the anode being electrically connected to the cathode via a via hole 1506. The via hole 1506 can be formed by etching or laser beam machining.

Figure 6:
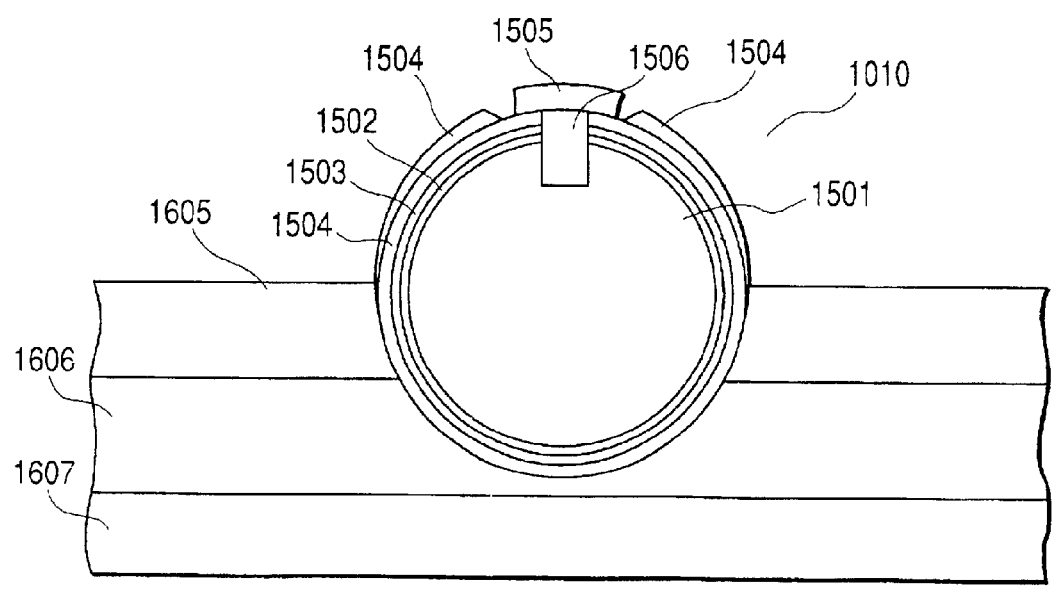
FIG. 6 is a schematic sectional view illustrating the present invention.

The light receiving part 1010 is then embedded in the optical transmission medium. More specifically, it is embedded to such an extent that it reaches the clad layer 1605 and core layer 1606 as shown in FIG. 6. Reference numeral 1607 denotes a clad layer.

To embed the light receiving part, a cavity corresponding to the embedding region needs to be made in the optical transmission medium. The cavity corresponding to the light receiving part is formed by heating a metal die for boring and pressing it against the optical transmission medium. The semiconductor device of the present invention is completed by embedding the light receiving part 1010 in the cavity formed. By applying a reverse bias between the cathode 1504 and anode 1505, the light incident upon the light receiving part 1010 is absorbed by the pn junction and obtained as an electric signal.

As explained above, a semiconductor device with significantly reduced direction dependency (directivity) of light propagating through the optical transmission medium is produced in this way. Moreover, the light receiving part can directly receive light that has propagated through the optical transmission region.

A spherical device has been used as the light receiving part, but the light receiving part is not limited to a spherical device and can have any shape if it can at least be embedded in the optical transmission medium, for example, a normal photodiode having a pn junction.

It is also possible to form not only the light receiving part but also light emitting part by using the spherical device and embed portion thereof in the optical transmission medium. It is further possible to form an electric wiring layer over the entire optical sheet. It is also preferred to provide the above-described optical sheet under the electric wiring printed substrate and form an optical wiring in place of a portion of the wiring as required.

Embodiment 2: Method of Adding Electronic Device

In view that the present invention reduces direction dependency of the light receiving part, the following method of adding electronic device can be used.

Figure 7:
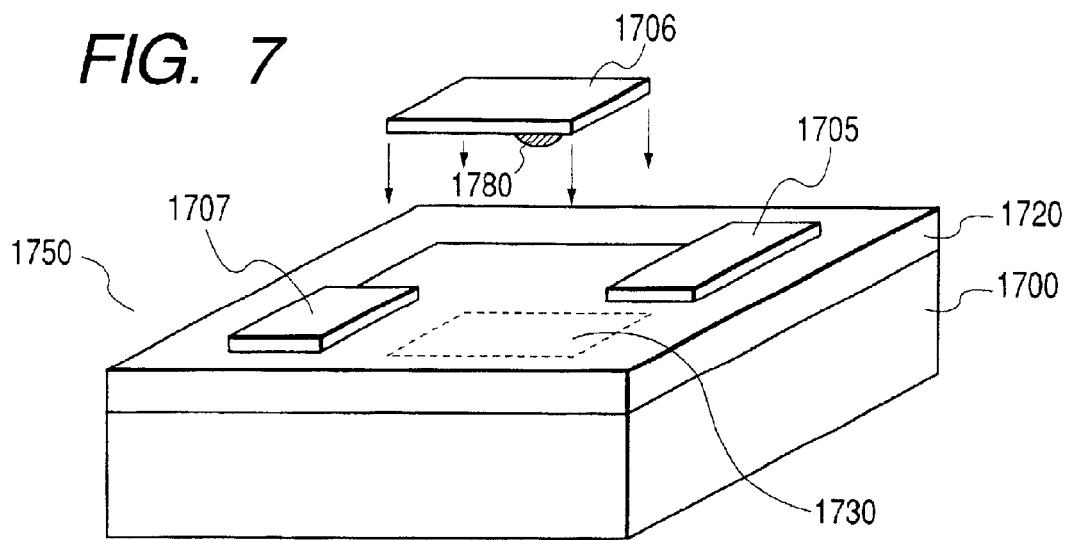
FIG. 7 is a schematic perspective view illustrating the present invention.

This embodiment will be explained referring to FIG. 7 to FIG. 9. In FIG. 7, reference numeral 1750 denotes an optoelectronic board. Reference numeral 1700 denotes an optical transmission medium; 1707 and 1705, electronic devices. The electronic device 1705 is provided with a light emitting part (not shown) capable of propagating signal light to the optical transmission medium 1700. Reference numeral 1720 denotes an electric wiring layer (e.g., a printed substrate).

When a new electronic device 1706 is added to an empty region 1730 of the optoelectronic board 1750, if no optical transmission medium is provided, it is only possible to merely add the electronic device 1706 and carry out electric wiring between the individual devices. However, in the case of the optoelectronic board 1750, it is possible to use optical wiring, for example, between the electronic devices 1705 and 1706. In FIG. 7, reference numeral 1780 denotes the light receiving part made according to the above-described method.

Figure 8:
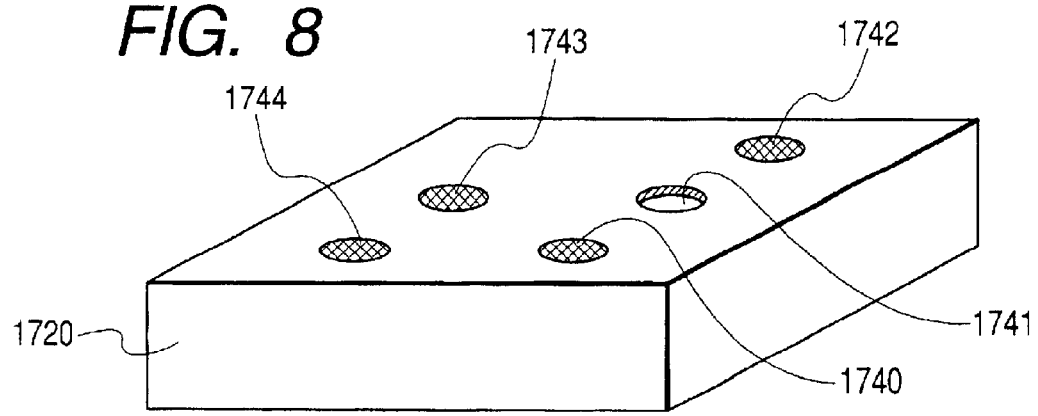
FIG. 8 is a schematic perspective view illustrating the present invention.

The optical transmission medium 1700 is provided beforehand with cavities for embedding as shown in FIG. 8. The number of cavities for embedding can be one or plural. It is preferred that a plurality of cavities be made beforehand from the standpoint of the degree of freedom of layout. For example, it is possible to form an array of cavities. In FIG. 8, reference numeral 1741 denotes a cavity for embedding the light emitting part of the electronic device 1705. Unused cavities 1742 and 1744 can be filled with resin, etc. This is effective when light propagating through the optical transmission medium is scattered unnecessarily by unused cavities. It is also preferred to provide a difference in the etching characteristic between the resin that fills a cavity and its periphery to make it easier to remove the filler of the cavity.

This embodiment uses a cavity 1740 to add the electronic device 1706 and a cavity 1743 to add the electronic device 1707.

Figure 9:
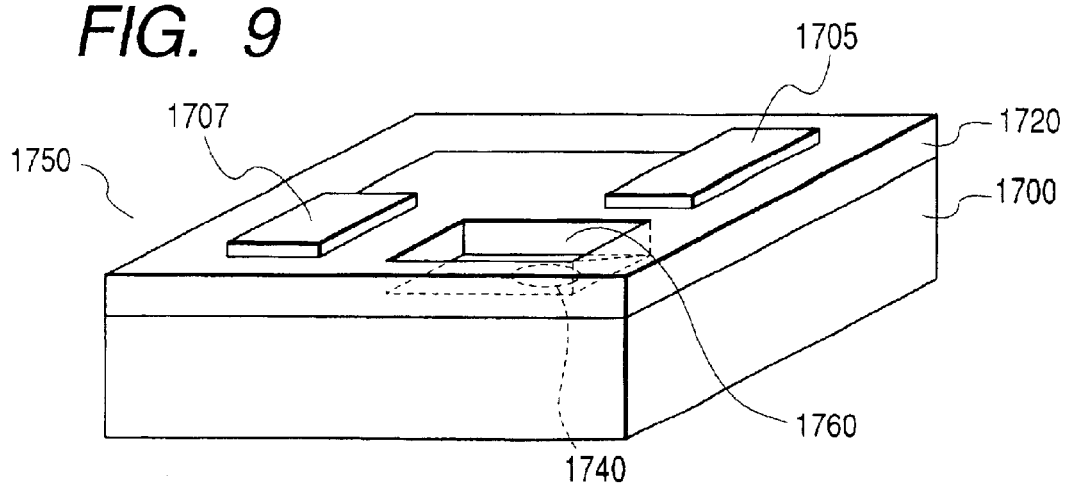
FIG. 9 is a schematic perspective view illustrating the present invention.

As shown in FIG. 9, a region where the electronic device 1706 is added is removed and the cavity 1740 is exposed. Reference numeral 1760 denotes the removed part. Of course, such a process can be omitted if the electric wiring layer 1720 is not formed in the region 1730 shown in FIG. 7. Then, if the cavity 1740 is filled with some filler, this is removed by etching, etc. Then, the device is added in such a way that the light receiving part 1780 of the electronic device 1706 is embedded in the cavity 1740. Since the electronic device 1705 has the light emitting part, it is possible to connect between portions of the electronic devices 1705 and 1706 by optical wiring using the optical transmission medium 1700 which is not used until the electronic device 1706 is added.

When a new device is added to an extremely small printed substrate such as built in a cellular phone, this embodiment allows optical wiring to be used and makes it possible to reduce influences of EMI caused by the addition of the electronic device.

When a new electronic device is added assuming that the existing wiring pattern is used, the existing circuit group may be affected by EMI caused by the merely added electronic device. In such a case, optical wiring can be used as in the case of this embodiment.

Figure 35:
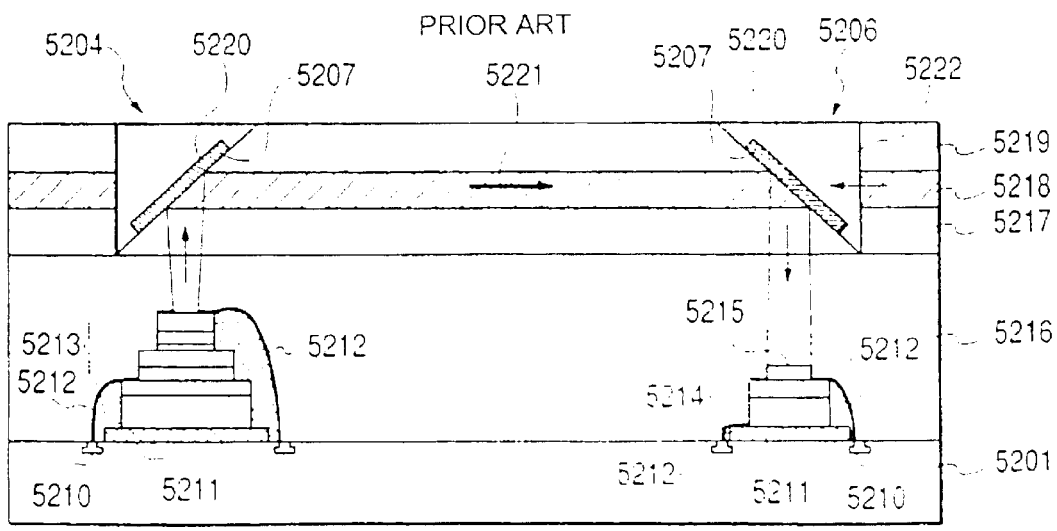
FIG. 35 is a schematic sectional view illustrates a conventional example.

When a linear waveguide is formed beforehand according to the position of the newly added electronic device, optical wiring in the configuration shown in FIG. 35 can also be used. But this significantly reduces the degree of freedom of layout. This is because the location where the new device is added is dependent on the location of the linear waveguide formed beforehand. Use of a two-dimensional optical waveguide as in this embodiment allows optical wiring with high degree of freedom of the device layout.

Embodiment 3: Photoelectric Two-layer Substrate+ Spherical Light I/O Device

FIG. 3 is a schematic perspective view for illustrating this embodiment of the present invention.

In FIG. 3, reference numeral 1101 denotes an optoelectronic board; 1102, a two-dimensional optical waveguide layer (hereinafter referred to as "optical sheet") formed inside the optoelectronic board; 1103, 1106 and 1107, electronic devices formed on the surface of the optoelectronic board (e.g., CPU, RAM, RF oscillator); 1104, electric wiring formed on the surface; 1105, optical wiring formed by light that propagates through the above-described optical sheet.

First, the method of producing the optical sheet will be explained.

The structure of the optical sheet is not limited to a particular structure if it can transmit light for at least a predetermined distance, and it is preferred that the structure satisfies the following conditions.

(1) The optical sheet can have a two-dimensional slab type optical waveguide for guiding light.

It is preferred that the propagation loss of the optical sheet is as small as possible but the propagation loss depends on the transmission distance. For example, for transmission loss of 0.1 dB/cm, a substrate of several cm per side can be used.

(2) Electric wiring can be formed on the surface of the optical sheet.

This is intended to exploit a conventional electric wiring pattern as such.

A structure of the optical sheet satisfying the above-mentioned (1) and (2) can be obtained by using PMMA for the support substrate and the clad layer and by using an organic resin such as polyimide for the optical waveguide layer. It is preferred that the optical transmission layer be provided over the entire surface under the electric wiring layer.

FIG. 4 is a schematic sectional view for showing the portion 4 of FIG. 3. The following is an explanation of a case where the electronic device 1103 makes an optical interconnection using the optical sheet 1102. FIG. 4 illustrates a case where the light receiving part 1201 and the light emitting part 1208 are separated from the electronic device 1103. Of course, the light receiving part and the light emitting part may also be built in the electronic device 1103 itself.

Reference numeral 1207 denotes a resin substrate (also serves as a clad layer); 1205, a clad layer; 1206, a core layer of higher refraction factor than the members 1205 and 1207. The substrate was 0.5 mm thick, the core layer was 0.1 mm and the clad layer was 0.3 mm, but each thickness is not limited to these sizes.

The optical sheet is obtained by integrating these three layers. It is possible to make a flexible substrate with high bending strength by using a flexible PMMA substrate as the substrate, and polyimide resin which can be used for coating of the core layer and clad layer.

This embodiment uses an optical I/O device (spherical optical device) formed of a compound semiconductor on a spherical Si substrate.

This spherical optical Si substrate will be explained in brief. (Items related to the spherical device are described, for example, in Japanese Patent Application Laid-Open No. 12-31190).

FIG. 5 shows a schematic view of the spherical optical device. In FIG. 5, reference numeral 1501 is a spherical p-type Si substrate; 1502, a P-type AlGaAsN clad layer; 1503, an undoped GaAsN active layer; 1504, an n-type AlGaAsN clad layer. A GaAsN-based compound semiconductor is used here because (1) its band gap is small and it has an excellent temperature characteristic and (2) it facilitates lattice matching with Si. It is also possible to use other materials including the substrate.

At an electrode section of this ball IC, an anode 1505 and cathode 1504 electrically connected to a via hole 1506 are formed. This embodiment uses the light emitting element and light receiving element of the same structure, but they may have different structures. It is preferred that the cathode 1504 have a windowed structure or mesh structure to allow light to be input/output.

When the ball IC is operated as the light emitting element, carriers are injected into a pn junction by applying a forward bias between the cathode 1504 and anode 1505, thereby generating light emission. The light generated is radiated from the light emitting window in a wide range of angles.

On the other hand, when the ball IC is operated as the light receiving element, the light incident upon the incident light window from a wide range of angles is absorbed as an electric signal by the pn junction and taken in by the adjacent electronic device by applying a reverse bias between the cathode 1504 and anode 1505.

Both the light emitting device and light receiving device have a spherical surface, and therefore the ability to input/output light with a wide range of angles constitute an outstanding feature of this embodiment.

The ball IC of this embodiment can be produced not only for the optical I/O section but also for other ICs simultaneously. The method of producing ICs and their exposure method are disclosed in Japanese Patent Application Laid-Open No. 10-294254 (U.S. Pat. No. 6,097,472) "Spherical Device Exposure Apparatus and Fabrication Method", etc.

This embodiment uses a preamp operating on 3.3 V in a CMOS configuration to be used for the light receiving element.

The method of mounting this spherical optical device will be explained using FIGS. 10 to 12.

First, a hemispherical cavity is made in the above-described optical sheet substrate which can allow the above-described ball IC to be embedded. The boring method can be selected arbitrarily. The cavity may be formed at a predetermined location using photolithography and etching or the cavity may be formed individually at an arbitrary location using laser, etc. This embodiment uses thermal fusion process.

Figure 10:
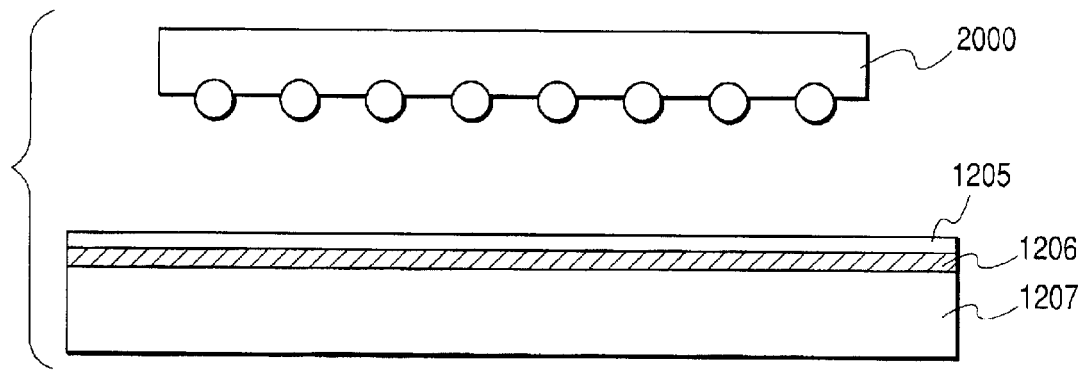
FIG. 10 is a schematic sectional view illustrating the present invention.
Figure 11:
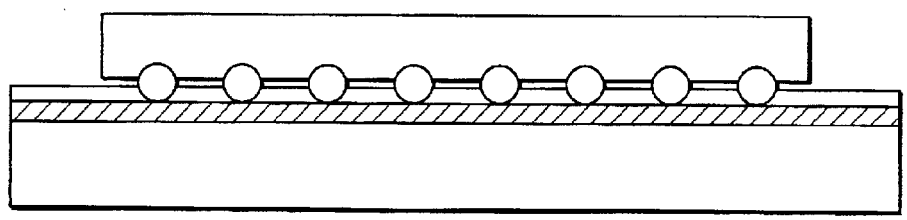
FIG. 11 is a schematic sectional view illustrating the present invention.
Figure 12:
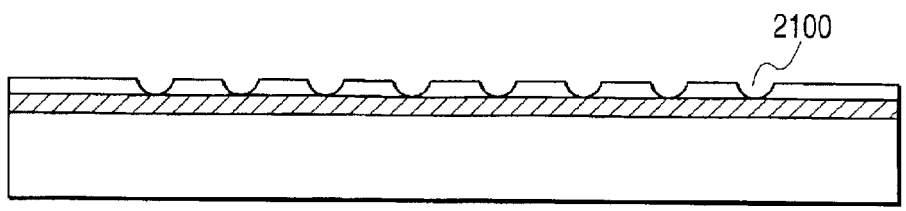
FIG. 12 is a schematic sectional view illustrating the present invention.

As shown in FIG. 10, metal balls are used as a die 2000, heated and pressed against the above-described resin substrate 1207 (FIG. 11) and hemispherical cavities 2100 are produced (FIG. 12). The depth of the cavities is set such that it reaches the vicinity of the core layer of the optical wiring substrate. Of course, it is also possible to dent to an extent that the cavity reaches the lower part of the core layer.

After this process, electric wiring 1104 is printed on the optical sheet as shown in FIG. 4 and then an electronic device represented by an LSI is mounted. Any method can be used for mounting, and in this embodiment, a flip chip mounting method is used.

The optical I/O section is mounted in the cavity of the optical sheet in such a way that the optical I/O section is arranged on the bottom of the cavity. The optical I/O section is positioned and fixed so that the optical I/O section is brought into contact with the bottom of the cavity to allow light to be taken in or out (see FIG. 13). Since the optical I/O section in this embodiment is spherical, strict positioning accuracy is not required. After the cavity 2100 and spherical device are positioned, they are fixed by UV hardening resin, etc.

Finally, the spherical optical I/O device and the surface-mounted electronic device are connected by means of printed electrical wiring. For this, it is preferred to use bump or plating.

Figure 13:
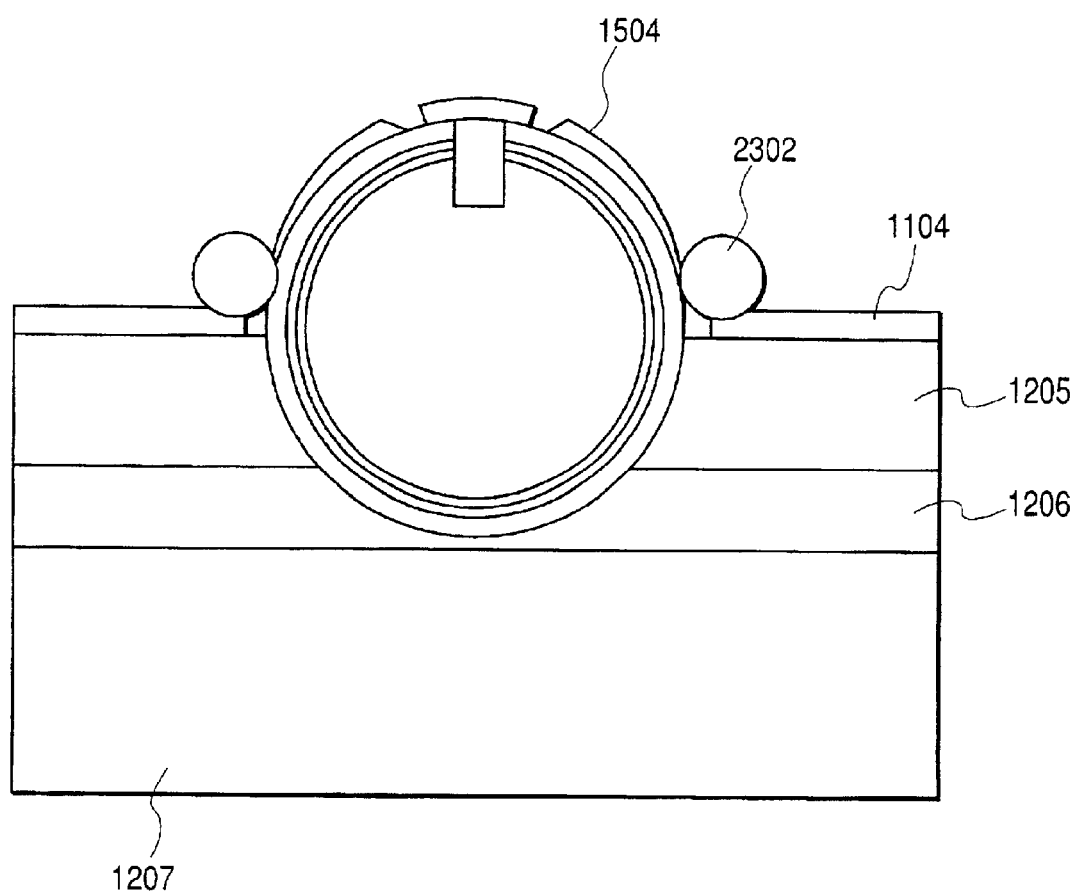
FIG. 13 is a schematic sectional view illustrating the present invention.

FIG. 13 shows an example where a print wiring 1104 and an electrode 1504 are connected via a bump 2302.

This embodiment shows an example where a spherical IC is used as the E/O and O/E conversion section but this embodiment is not limited to this example.

Principle of Operation

The principle of operation will be explained below.

First, the transmission function will be explained.

FIG. 4 is an enlarged view of the portion 4 of FIG. 3. In FIG. 4, an output electric signal (CMOS logic) of the I/O section of an LSI 1103 can be transmitted to an adjacent electronic device via electric wiring 1104.

However, it is also possible to generate an output optical signal 1211 by directly driving an adjacent optical I/O device (e.g., a spherical optical device) and use it as optical wiring via the optical waveguide layer (optical sheet) 1206. Either method can be selected as required.

A case where an adjacent spherical optical device is driven will be considered.

An LSI logic signal (e.g., 3.3 V in the case of CMOS) is a voltage enough to drive the above-described spherical optical device. By applying a logic signal as a forward bias to the spherical optical device, the electric signal is converted to an optical signal.

At this time, since light is radiated over the entire spherical surface, light spreads and propagates over the entire surface of the optical sheet without a special optical system. As a result, it is possible to secure 80% or more as the efficiency of coupling with the optical waveguide.

Then, the reception function will be explained.

When an input optical signal 1210 propagating from an arbitrary direction of the optical sheet 1206 reaches the surface of the spherical light receiving element 1201, it is taken in, absorbed near a reverse-biased pn junction and converted to an electronic signal. The converted electric signal is taken in by the adjacent LSI 1103 and processed as the input electric signal 1203. In this case, if a preamp for amplifying the electric signal is integrated on the surface of the spherical optical device, the electric signal can be restored to a CMOS compatible voltage.

Thus, using the present invention can reduce direction dependency of the light receiving part.

When a plurality of metal wires is placed close to each other, if a high-speed data communication is performed (e.g., 1 Gbps), the strength of nearby electromagnetic noise is expressed by "strength of the noise source (frequency, waveform, drive current)"×"transfer constant (resonance with power line, coupling with adjacent line)"×"antenna factors (connector, electrode)".

That is, the longer the wiring length or the greater the current value or the greater the signal speed or the closer the signal pulse to a square wave, the higher the noise level becomes.

Therefore, when metal wires are used near the CPU, etc. which requires high-speed processing, it is impossible to completely eliminate EMI.

On the other hand, using optical wiring as in the case of this embodiment can solve this problem. This is because optical wiring is free of electromagnetic induction and the transfer constant becomes zero.

Above all, as in the case of this embodiment, by separating and placing the electric wiring layer and optical transmission layer as two layers and using a two-dimensional optical waveguide (optical sheet) as the optical transmission layer, it is possible to provide an optoelectronic wiring substrate which prevents influences of EMI caused by a specific device and also facilitates the production process.

On the other hand, the physical dimensions required for wiring per optical wire when the optical waveguide (so-called one-dimensional waveguide) is used are greater than electric wiring by one or more orders of magnitude. Therefore, changing all electric wiring to optical wiring increases demerits such as increasing the size and increasing loss by bending, etc.

Furthermore, there is also a demerit that introducing optical wiring makes it unavoidable to change conventional electric wiring patterns.

This embodiment solves the above-described two demerits by using a two-dimensional optical waveguide (optical sheet) as the optical transmission layer. Applying a two-dimensional optical waveguide (sheet-shaped optical waveguide) to the optical waveguide which provides optical wiring increases the degree of freedom of layout. Furthermore, when light is transmitted from the light emitting part to the optical sheet, it is possible to two-dimensionally transmit optical data from the light emitting device in all directions.

Furthermore, it is desirable that the light emitting device connectable to the two-dimensional optical waveguide can emit light in all two-dimensional directions and that the light receiving device can receive light from all two-dimensional directions. Examples of the above-described devices include optical devices formed on a spherical surface.

When the light receiving element with a spherical surface is used, it is possible to design the device so that it can receive light from all directions. This appears as an effect of drastically relaxing the mounting accuracy when light from a waveguide whose propagation direction is fixed is taken in.

By building an amplifier circuit into the bias circuit in the spherical optical device, it is possible to operate this single spherical optical device as the optical I/O element. This makes it possible to reduce influences on the conventional design of electronic circuits and realize optical interconnection.

Embodiment 4: Clock Distribution

An application example of the present invention will be explained below.

FIG. 3 shows a case where a plurality of electronic parts (CPU and memory, etc.) 1103 are mounted on one substrate 1101 and a portion of the wiring is coupled with the substrate through the spherical optical device 1201 as in the case of Embodiment 3.

In FIG. 3, the LSI 1106 is a clock generator. At this time, a clock signal is sent to the optical waveguide of the optoelectronic board via the spherical optical device 1208 (FIG. 4). The signal for which optical wiring is selected is output to the spherical optical device and is driven by the signal sent by the CMOS itself. No special driver is required. For this reason, a GaAsN-based semiconductor laser which operates on a low voltage is used as the optical device.

The spherical optical device 1208 converts the clock signal to light and distributes the clock signal converted to the optical signal to all devices on the substrate. Since any electronic device (e.g., MPU 1103) on the substrate is provided with the spherical optical device 1201, it receives the optical signal from the clock generator 1106. Since the spherical optical device 1201 has a spherical shape, it can receive light from any direction with high light receiving efficiency.

The light received is separated into pairs of electrons and holes, with the electric signal being amplified by a preamp formed on the spherical optical device of an adjacent LSI and taken in by the MPU. Other devices (e.g., RAM) can also receive the clock signal using a similar method and therefore these devices can also be operated with a common clock.

Conventionally, when a clock signal is distributed to individual devices, wiring patterns cannot be selected freely or wiring distances cannot be equalized, and therefore it is not possible to ignore influences of EMI caused by transmission delay and high-speed, large current operation. However, according to this embodiment, optical wiring with the shortest distance and with no electromagnetic induction can be carried out to solve these problems all at once.

Embodiment 5: MPU→Memory (Serial Transmission)

Then, another application example will be explained.

Figure 14:
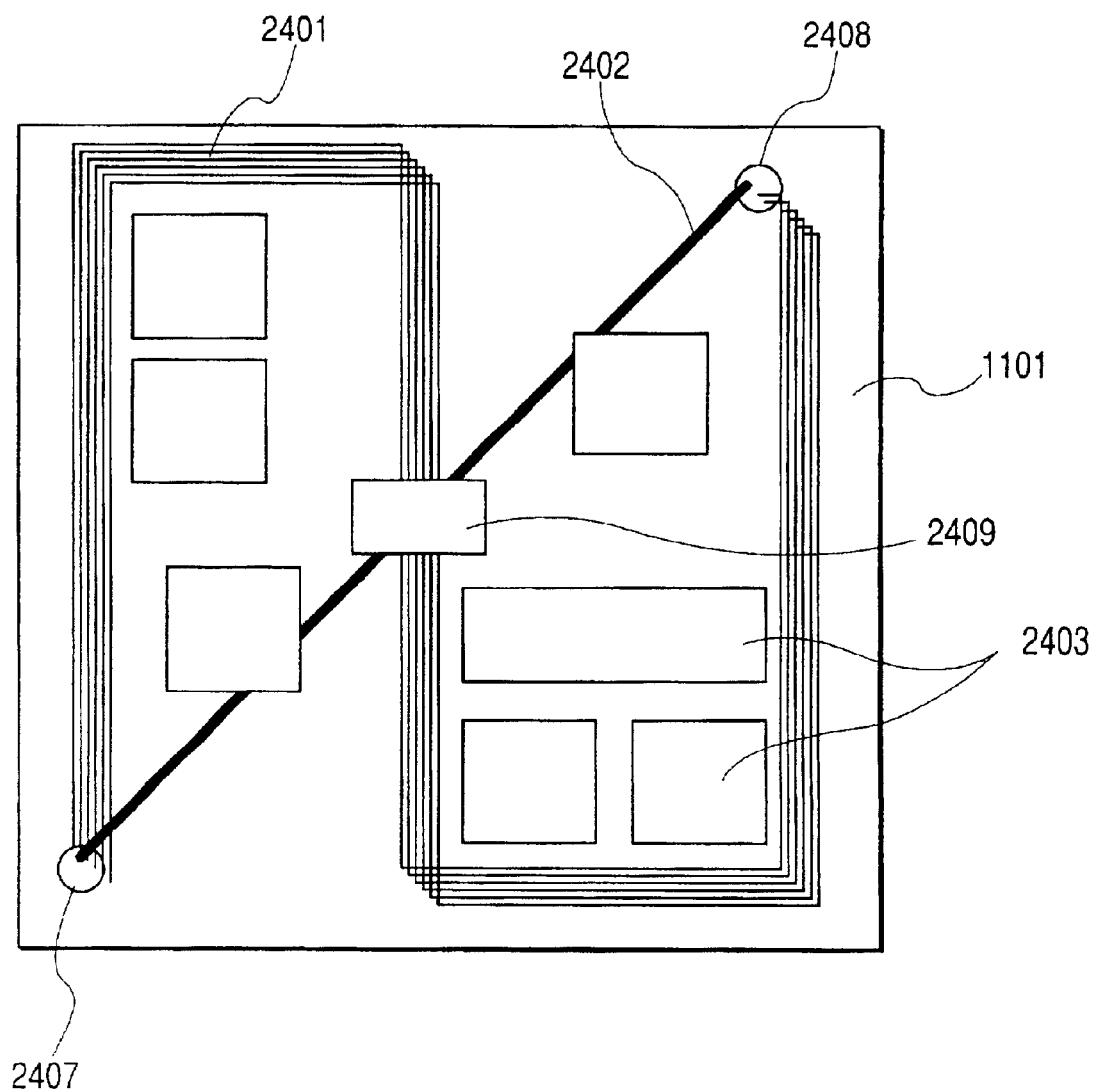
FIG. 14 is a schematic top view illustrating the present invention.

FIG. 14 is a schematic view for illustrating another embodiment of the present invention. In FIG. 14, reference numerals 2407 and 2408 denote two CPUs. Reference numeral 2409 denotes a RAM shared by these two CPUS (2407, 2408). In FIG. 14, reference numeral 2401 denotes electric wiring for parallel transmission, and 2402 denotes optical wiring ring for serial transmission. Reference numeral 2403 denotes LSIs.

Normal electric wiring requires, for example, 64-bit data wires 2401 with 6 transmission paths.

In applications (moving images) of sending large-volume data at high speed, data may not be correctly sent using conventional wiring for the above-described reasons (transmission delay and EMI). In such cases, optical wiring can be used. Specifically, a part or all of signal transmission between CPUs (2407, 2408) and RAM 2409 is carried out using the optical wiring 2402.

Further, in FIG. 14, in order to send data from the MPU to the memory using 64 bits, 6 electric wires are necessary, but performing parallel/serial conversion at the final stage of the MPU and connecting one optical I/O element allows the electric signal to be transmitted as an optical signal through the optical waveguide of the optoelectronic board, received by the optical I/O element on the receiving side and converted from serial to parallel, resulting in a 64-bit parallel signal.

When the optical signal is converted from parallel to serial, the clock becomes higher, but since the signal propagates through the optical waveguide, there is no problem of EMI.

This embodiment selects optical wiring from the beginning, but it is not always necessary to use only optical wiring. That is, by allowing electric wiring paths to also be selected, it is possible to sometimes connect electric wiring and sometimes connect optical wiring. This flexibility is one of the features of the present invention.

In the case of electric wiring, wiring may be performed in such a way as to bypass other devices to avoid EMI, resulting in an increase of the wiring length, causing transmission delay and distortion of waveforms. Selecting optical wiring at this time makes it possible to provide shortest EMI-free connections, which in turn prevents transmission delay and distortion of waveforms.

The final decision as to which signal should be applied to electric wiring or optical wiring is made by the device that controls the bus.

The converted light spreads and propagates through a two-dimensional optical waveguide and reaches an IC located in another place. Near this IC, a ball IC for O/E conversion is also placed. This embodiment places the same ball IC. Since it has a spherical surface, light directly hits the pn junction surface without using any prism or mirror, etc., which provides an extremely easy way of mounting.

Embodiment 6: Integrating Pin-PD and Amp on Ball Si

Figure 15:
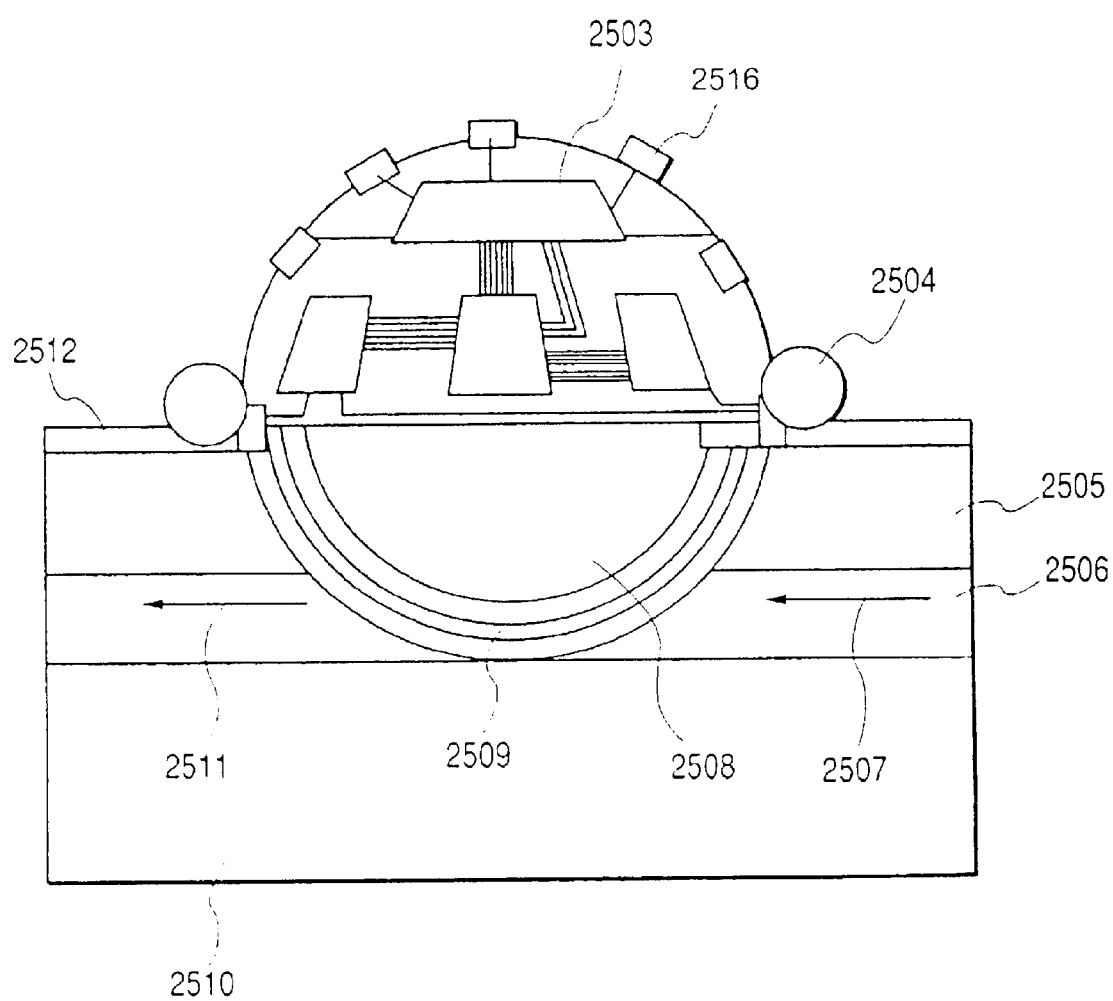
FIG. 15 is a schematic sectional view illustrating the present invention.

FIG. 15 is a schematic view for illustrative another embodiment of the present invention. In FIG. 15, reference numeral 2508 denotes a spherical Si substrate and its northern (upper) hemisphere shows the surface and its southern (lower) hemisphere shows a sectional view. Reference numeral 2509 denotes a light receiving element formed on the southern hemisphere: 2503, an IC such as a bias circuit that drives the light receiving element or a preamp that amplifies an electric signal. Reference numeral 2510 denotes a optical waveguide substrate: 2506, a core layer: 2505, a clad layer: 2516, an electrode: 2512, printed wiring: 2504, a bump; 2511, output light; 2507, input light.

The method of producing the semiconductor device shown in FIG. 15 will be explained below.

Figure 16:
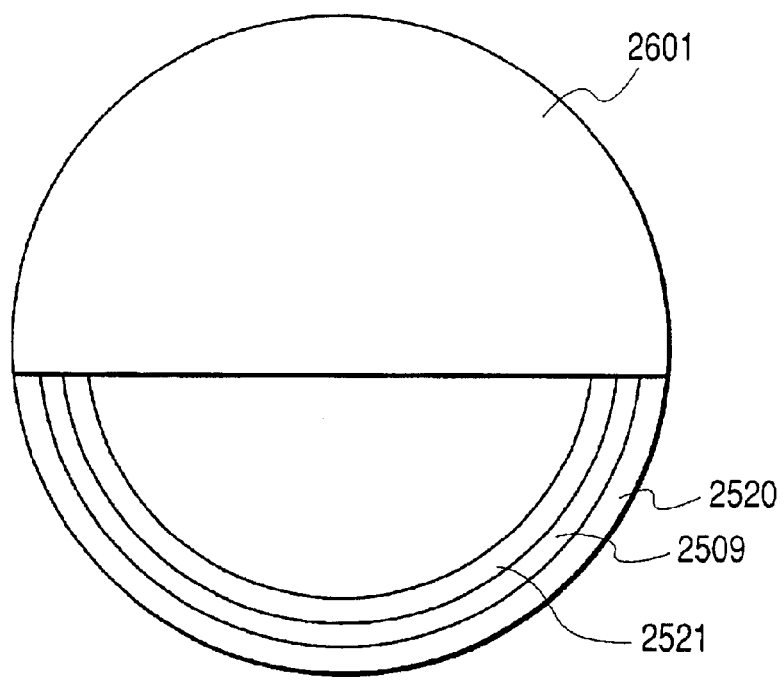
FIG. 16 is a schematic view illustrating the present invention.

First, as shown in FIG. 16, a p-Si layer 2521, i-Si layer 2509 and n-Si layer 2520 are formed on almost half (southern hemisphere) of an undoped spherical Si substrate 2601 (diameter: about 1 mm) by ion implantation to form a light receiving element region. The depth is around 0.3 $\mu$m. Crystal recovery is performed through annealing processing as required.

Figure 17:
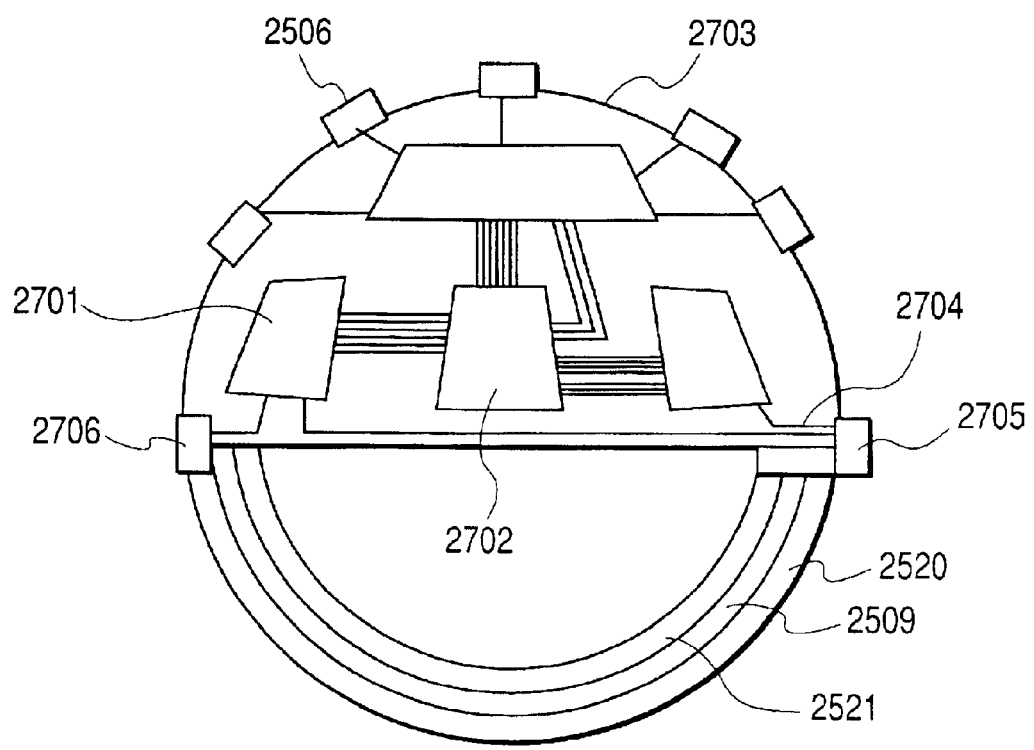
FIG. 17 is a schematic view illustrating the present invention.

Then, as shown in FIG. 17 (the upper half of the sphere expresses the spherical surface and the lower half expresses a section of the sphere), a bias circuit 2701 for applying a reverse bias to this light receiving element, a preamp circuit 2702 for amplifying the electric signal converted from the optical signal to a desired voltage level, and a waveform shaping circuit 2703, etc. are formed on the remaining spherical surface region (northern hemisphere). Reference numeral 2704 denotes electric wiring, 2705; a light receiving element electrode; 2506, an electronic circuit electrode. Since the electrodes 2705 and 2706 are the electrodes for applying voltage to the p-Si layer 2521 and n-Si layer 2520 respectively, the potential of the electrode 2705 is prevented from being applied to the n-Si layer 2520.

Here, all electronic circuits use a 3.3 V CMOS logic circuit. At the same time, all electronic circuits form a positive electrode 2705 and negative electrode 2706 of the light receiving element and a wiring pattern 2704. Furthermore, reference numeral 2506 denotes an external electrode for input/output of the electronic circuit.

An example of the mounting method will be shown below. In FIG. 15, for example, reference numeral 2510 denotes a clad layer made of PMMA which also serves as a substrate; 2506, a (sheet-shaped) core layer which serves as a optical waveguide; 2505, a clad layer.

Photosensitive polyimide, etc. is applied to form the core layer 2506 and clad layer 2505, and a cavity for fitting therein is made to allow the spherical optoelectronic device of the present invention is formed by using a photolithography technology, etc. After a desired wiring pattern is printed thereon, the optoelectronic device of the present invention is fixed with UV-hardened resin (not shown).

Figure 18:
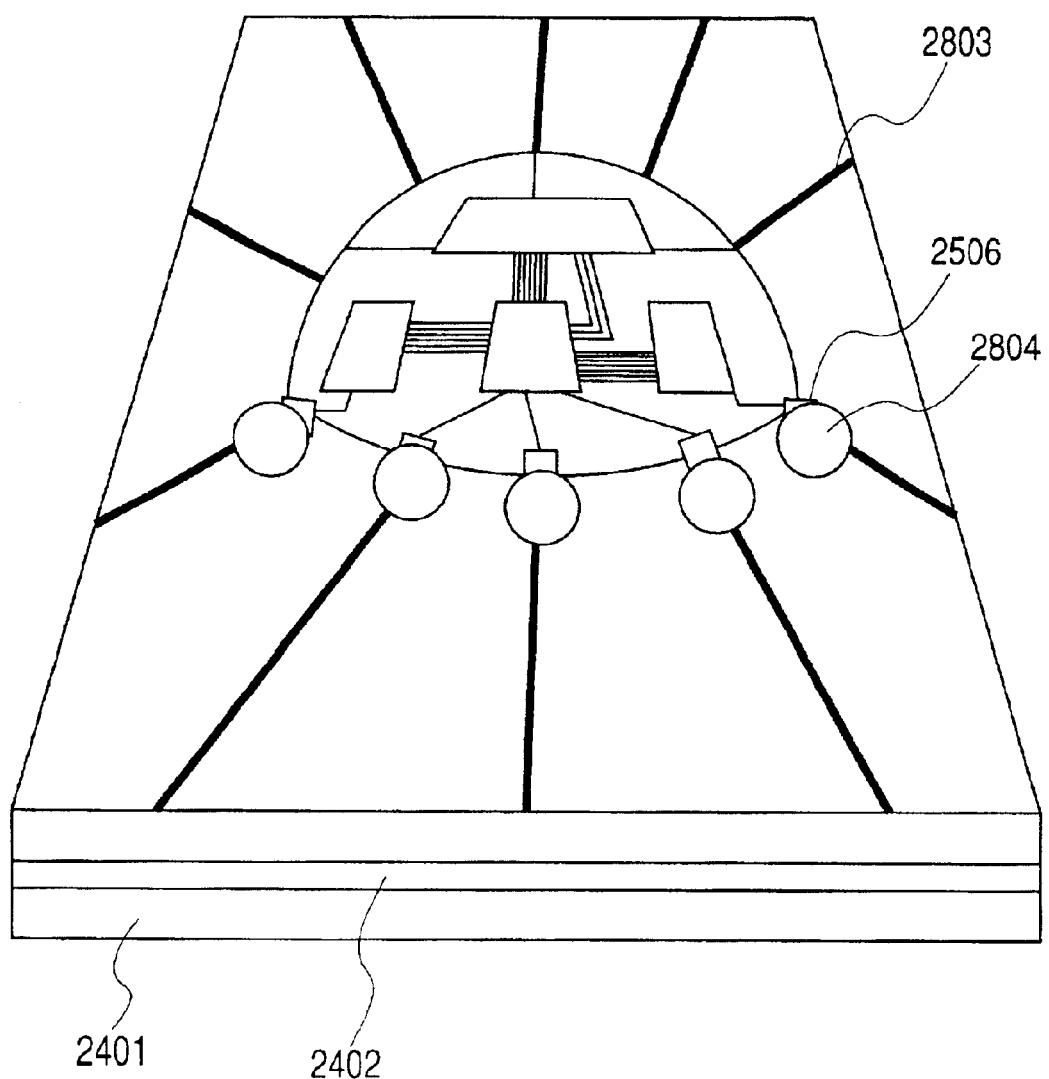
FIG. 18 is a schematic perspective view illustrating the present invention.

After this, as shown in FIG. 18, contact is made between the wiring pattern 2803 and the electrode 2506 on the device using an Au bump 2804, etc. In this process, plating may also be used instead of the bump.

In FIG. 18, 2401 denotes a clad layer, and reference numeral 2402 denotes the optical waveguide core layer.

The principle of operation will be explained below.

In FIG. 15 or FIG. 17, a reverse bias (e.g., 3.3 V) is applied to the pn junction of the optoelectronic device through the bias circuit 2701. At this time, this optoelectronic device can receive the optical signal propagating through the two-dimensional optical core layer 2506 from an arbitrary direction. This is because at least a portion of the light receiving part is embedded in the optical transmission medium.

The input optical signal is taken in, absorbed near the reverse-biased pn junction and converted to an electronic signal. The converted electric signal is amplified as the input electric signal by the adjacent preamp 2702 to a CMOS logic level, processed by a waveform shaping circuit 2701, etc. and sent to the printed wiring contacted via a bump.

From the above-described embodiments, it is possible to (1) receive light from any two-dimensional direction, (2) amplify or shape the waveform using an integrated electronic circuit, and (3) facilitate mounting. Furthermore, it is possible to (4) reduce influences on existing electronic circuits and allow a single device to serve as an optical interconnection I/O.

Embodiment 7: III–VN on Ball GaAs

This embodiment uses a spherical GaAs substrate instead of a spherical Si substrate.

Figure 19:
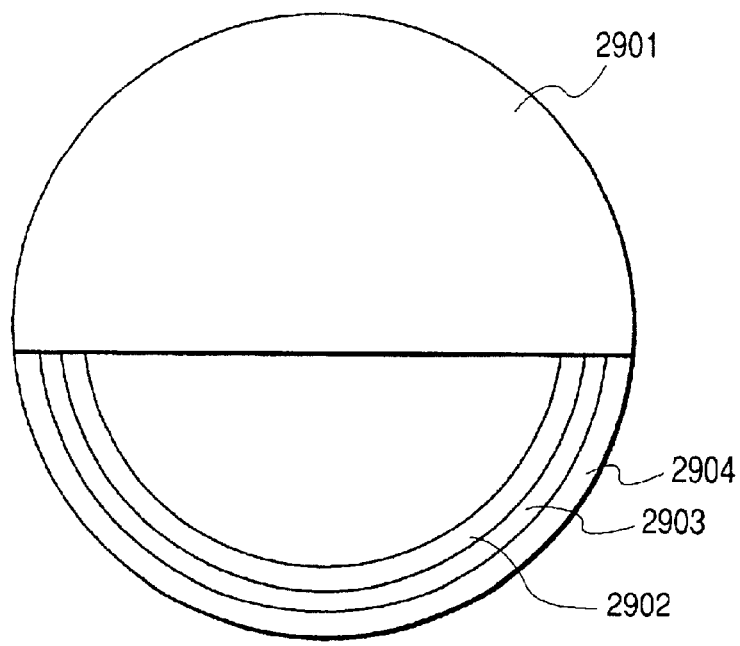
FIG. 19 is a schematic view illustrating the present invention.

The production method of this embodiment will be explained using FIG. 19.

From the surface of a high-purity undoped spherical GaAs substrate 2901, a p-type GaAs layer 2902, a GaAsN light-absorbing layer 2903 and an n-type GaAs layer 2904 are formed by means of ion implantation.

The concentration of p-type impurities is about 1E19 cm$^{-3}$ and the concentration of n-type impurities is about 1E18 cm$^{-3}$ (ion type can be determined arbitrarily). The undoped GaAsN is obtained by applying ion implantation of high concentration N to GaAs (e.g., 1E21 cm$^{-3}$). RTA (Rapid Thermal Annealing) is effective to eliminate damage during ion implantation.

With regard to the implantation depth, the ion implantation condition of other layers is set in such a way that the thickness of the GaAsN layer is 0.2 $\mu$m.

The subsequent processes and mounting process are in conformance with Embodiment 6. With regard to the electronic circuit section, using a bipolar process makes it possible to make an electronic circuit having a function equivalent to or higher than Embodiment 6. For the electrode, a mesh structure can also be used instead of a complete window structure.

This embodiment will be explained focused on differences from Embodiment 6. The operation as a light receiving device of this embodiment is the same as in the case of Embodiment 6. That is, by applying a reverse bias to the p-GaAs layer 2902 and n-GaAs 2904 in FIG. 19, the light incident upon the incident light window from a wide range of angles is absorbed by the pn junction and taken in as an electric signal by an adjacent electronic device. Since GaAsN has a smaller band gap than GaAs, GaAsN operates on a lower voltage than GaAs.

Furthermore, GaAsN has a greater mobility than Si, and can therefore respond fast. Reference numeral 2903 denotes an i-GaAsN layer.

Since GaAsN is a direct transition type compound semiconductor, it can also be used as a light emitting element. When GaAsN is operated as a light emitting element, by applying a forward bias to the electrode 2705 and 2706 in FIG. 15 or FIG. 17, the light emitted at the pn junction is radiated from the light emitting window in a wide range of angles. This may be driven by the logic data itself or driven through a driver circuit.

Since the surface of both the light emitting device and light receiving device is spherical, this embodiment has a major feature of being capable of letting in and out light in a wide range of angles.

Embodiment 8: GaAsN Films on Facets of Ball Si

Figure 20:
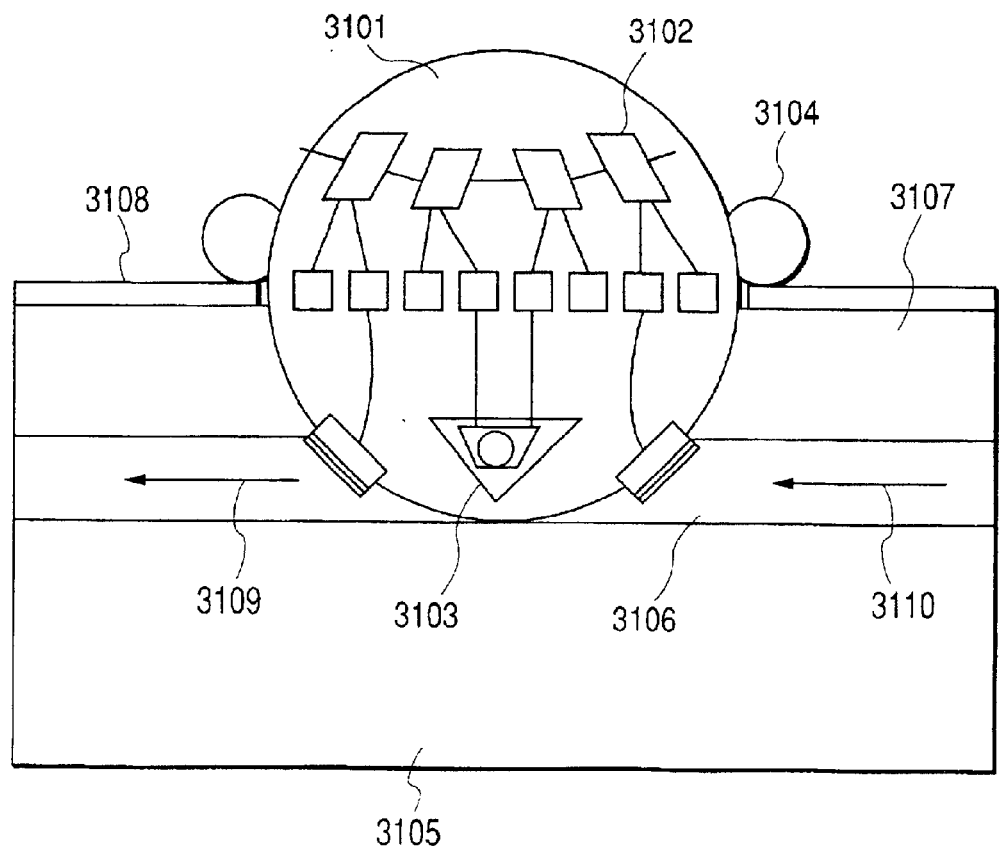
FIG. 20 is a schematic view illustrating the present invention.

FIG. 20 is a schematic view for illustrating another embodiment.

In this embodiment, GaAsN/AlGaAsN is stacked on a ball Si substrate to be used as a light emitting element or light receiving element. Reference numeral 3101 denotes a spherical semiconductor substrate; 3102, an IC; 3103, an optical device; 3104, a bump; 3105, a optical waveguide substrate; 3106, a core layer; 3107, a clad layer; 3108, printed wiring; 3109, output light; 3110, input light. The production method will be explained below.

Production of Ball IC

Figure 21:
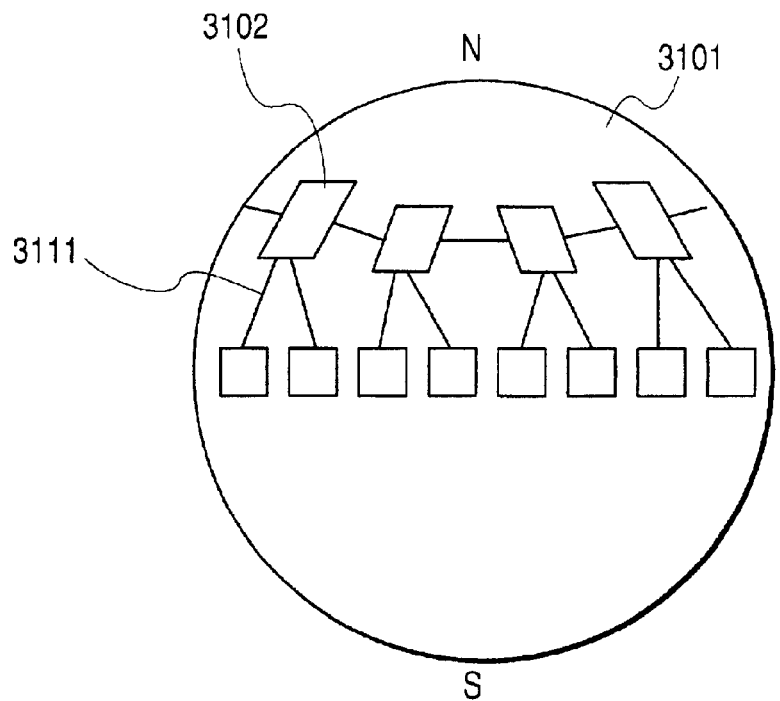
FIG. 21 is a schematic view illustrating the present invention.

As shown in FIG. 21, the IC 3102 is formed on the hemispheric surface (here, northern hemisphere) of an undoped spherical Si substrate (1 mm) 3101. This IC may be a drive IC or parallel-serial conversion circuit in the case where this IC is a light emitting element. This IC is a bias circuit, preamp, waveform shaping circuit or serial-parallel conversion circuit in the case where this IC is a light receiving element. Of course, when the IC is used for both functions, appropriate electronic circuits need to be added. These circuits can be made through a normal CMOS process and its logic voltage is 3.3 V. Reference numeral 3111 denotes electric wiring.

Production of Optical Device

After the Si ball IC process is almost completed, an optical device is produced. First, the entire sphere is covered with a nitride film (SiN), etc. and the region where the optical device is made is ground and polished to form a smooth surface. The sphere is covered with the nitride film to protect the electronic device during the optical device process and to be used as a selective growth mask. It is desirable to form a film with small stress (here, $Si_3N_4$ (200 nm thick) is used) to cover the spherical surface.

Figure 22:
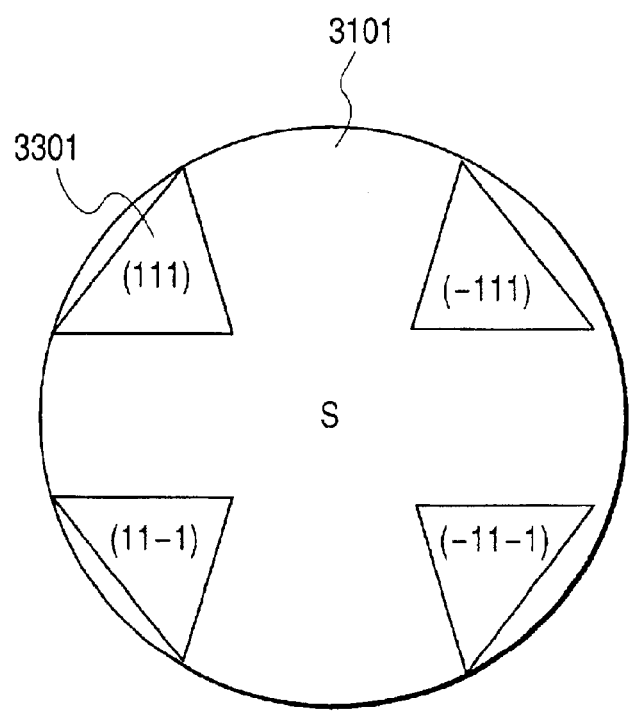
FIG. 22 is a schematic view illustrating the present invention.

As the region for producing the optical device, this embodiment uses plane (111) and planes associated therewith (four planes in total; (100), (010), (−100), (0−10)) 3301 (triangular plane approximately 20 μm per side) in the southern hemisphere. FIG. 22 is a plan view of FIG. 21 viewed from the S-pole of the sphere and reference numeral 3101 denotes the spherical substrate and 3301 denotes the (111) equivalent plane.

Figure 23:
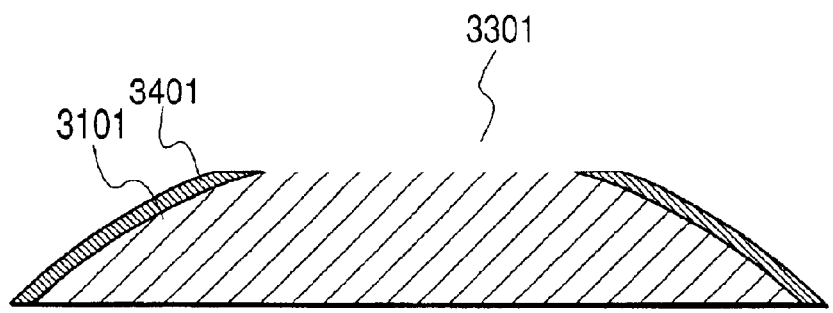
FIG. 23 is a schematic sectional view illustrating the present invention.

FIG. 23 is a sectional view of one of these planes. The entire surface may be covered with a nitride film, etc. again if necessary and a window is made only in the region for producing the device. Since selective growth takes place according to the shape of the opening, this embodiment controls the opening so that it becomes cylindrical. Reference numeral 3101 denotes the spherical semiconductor substrate; 3301, the plane (111); 3401, the SiN film. Here, the (111) equivalent plane is selected for the following reasons.

(1) Because they are chemically equivalent to each other, it is possible to make a uniform structure in the subsequent crystal growth. (If another crystalline plane is included, anisotropy occurs in aspects of composition, film thickness and direction of crystal growth.)
(2) In the plane contacting S-pole (in the light propagation direction), light is emitted in at least four directions or light is received from at least four directions. (This is not limited to the (111) equivalent plane provided that other planes have an equivalent function or higher function.)

Crystal Growth

Figure 24:
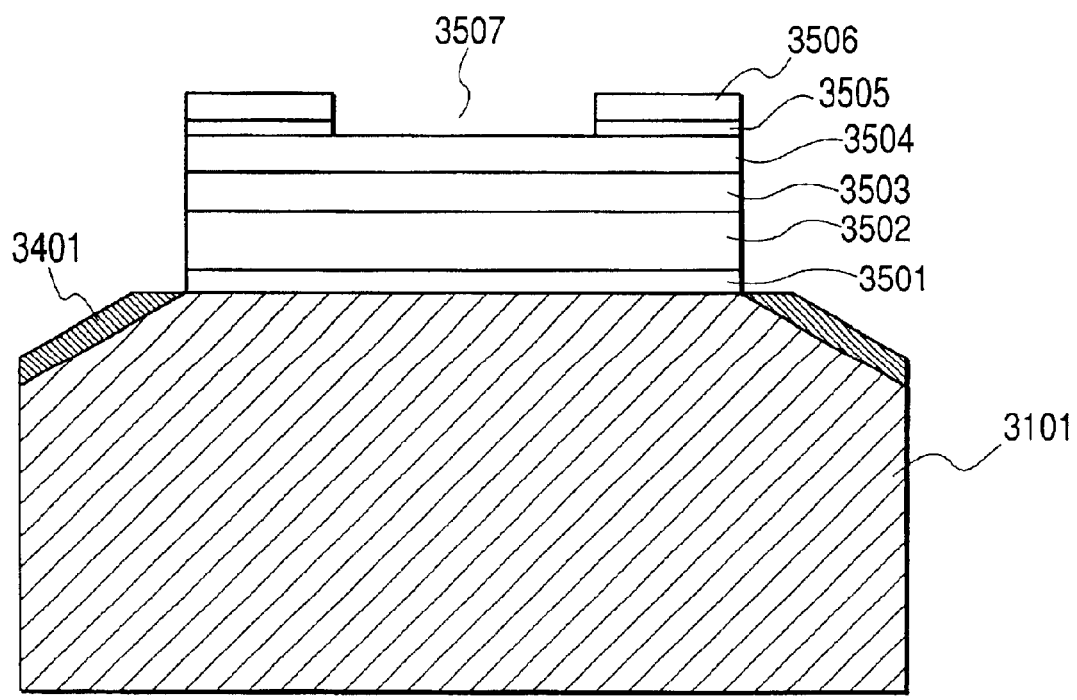
FIG. 24 is a schematic sectional view illustrating the present invention.

The structure of the device will be explained using FIG. 24. First, $GaN_xAs_{1-x}$ is stacked as a buffer layer 3501 on only a selected region (opening part) using a gas source MBE (molecular beam epitaxy) method or MOCVD (metalorganic chemical vapor deposition) method. The grating constant at this time can be selected as appropriate according to the conditions of the clad layer and active layer.

Here, after the nitrogen composition X is changed gradually from 0.2 to 0 so that it provides lattice matching with $In_{0.1}Ga_{0.9}As$, InGaAs is further stacked while changing the In composition gradually. After this, the n-InAlGaAs clad layer 3502, GaInNAs/InAlGaAsMQW (Multiple Quantum Well) active layer (light emitting wavelength: 1.3 μm) 3503, p-InAlGaAs clad layer 3504 and p-InGaAs contact layer 3505 are stacked one after another. A positive electrode 3506 is formed after a light input/output window 3507 is attached. Then, a negative electrode is formed from inside the sphere at a desired position, unnecessary nitride films are removed, wires are connected to the IC electrodes, and in this way this embodiment is completed. Reference numeral 3101 denotes the spherical semiconductor substrate and 3401 denotes the selection mask.

Mounting

Figure 25:
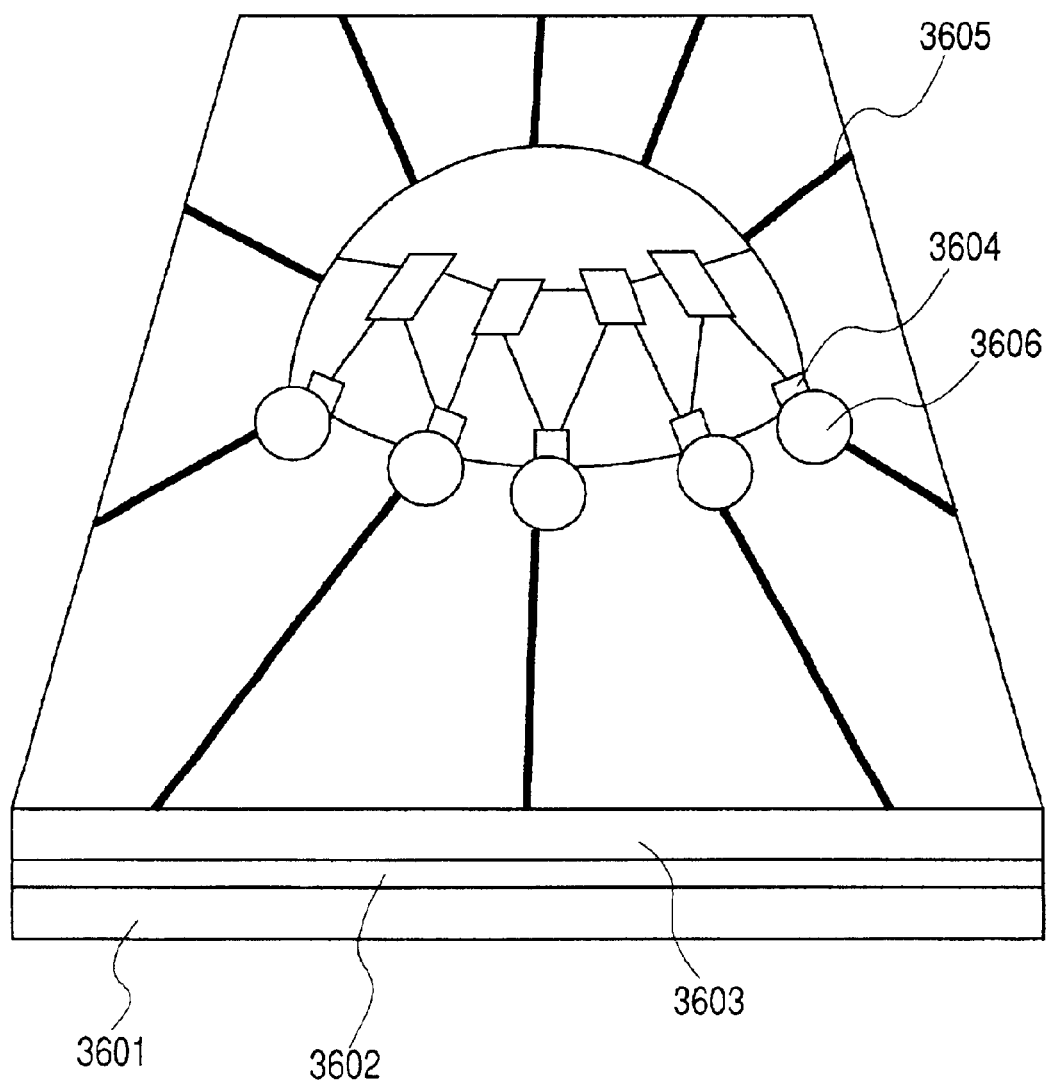
FIG. 25 is a schematic view illustrating the present invention.

A mounting example is shown in FIG. 25. In FIG. 25, reference numeral 3601 denotes a substrate of PMMA, etc., and 3602 denotes the optical waveguide core layer made of polyimide, etc. formed thereon. The clad layer such as of PMMA is further formed thereon. A cavity is formed on the clad layer 3603 and core layer 3602 using photolithography, etc. so that the above-described spherical optoelectronic device can fit therein. After this, the device is fixed with UV-hardened resin, etc. (not shown). Then, contact with the printed wiring 3501 is made using the Au bump 3502.

Principle of Operation

Then, the principle of operation will be explained.

In Case of Light Emitting Element

In FIG. 20 or FIG. 21, the electric signal supplied from the driver IC 3102 causes the light emitting element 3103 to generate an optical signal. This optical signal is emitted as output light to the mounted core layer. Since the element is directly optically coupled with the core layer, the light emitting element can efficiently guide light to the optical waveguide.

When the light signal is desirably emitted in all twodimensional directions, it is possible to simultaneously modulate the same signals and output an optical signal. In the actual case, four directions are used, but since this light emitting element is an LED and its directivity is weak, light propagates with a substantially uniform strength distribution in all directions. To obtain a more uniform strength distribution, it is possible to form the light emitting element in higher-degree planar directions than the (111) equivalent plane. Then, the emitted light propagates through the two-dimensional optical waveguide and thereby transmits its optical signal to this optoelectronic device.

In Case of Light Receiving Element

This embodiment can also be used as a light receiving element. In FIG. 20 or FIG. 22, a reverse bias (e.g., 3.3 V) is applied to the pn junction of the optoelectronic device by the bias circuit 3301. At this time, this optoelectronic device can receive an optical signal propagating through the two-dimensional optical core layer 3106 in an arbitrary direction. This is because the light receiving surface is spherical. The input signal is taken in, absorbed near a reverse-biased pn junction and converted to an electronic signal. The converted electric signal is amplified (or attenuated) by an adjacent preamp 3102 to the CMOS logic level, further processed by the waveform shaping circuit 3102, etc. and transmitted to the printed wiring contacted by a bump.

Effects

This embodiment has the following effects:

(1) It is possible to receive light from arbitrary two-dimensional direction.
(2) It is possible to carry out amplifying or waveform-shaping by an integrated electronic circuit.
(3) It is possible to easily carry out mounting.
(4) The influence on existing electronic circuits can be reduced, and a single device can be used as an optical interconnection I/O.

Embodiment 9: III–VN on Ball GaAs

This embodiment uses a spherical GaAs substrate instead of a spherical Si substrate. GaInNAs provides lattice matching with GaAs and therefore this embodiment has a feature of allowing easier band gap control than in the case of using an Si substrate. The method of producing it will be explained using FIG. 24.

Production of Ball IC

As shown in FIG. 21, an IC 3102 is produced on a part of the undoped spherical Si substrate 1 mm) 3101, for example, the hemispherical surface (here, northern hemisphere). This IC may be a drive IC or parallel-serial conversion circuit in the case of a light emitting element, and it may be a bias circuit. preamp, waveform shaping circuit or serial-parallel conversion circuit in the case of a light receiving element. Of course, when the IC is used for both functions, appropriate electronic circuits need to be added. These circuits can be made through a normal FET or Bipolar process. In FIG. 24, reference numeral 3101 denotes a spherical semiconductor substrate; 3501, a buffer layer; 3502, a clad layer: 3505, a contact layer: 3506, an electrode: 3507, a window 3401, a selection mask.

Production of Optical Device

After the GaAs ball IC process is almost completed, an optical device is produced. First, the entire sphere is covered with a nitride film, etc. and the region where the optical device is made is ground or polished to form a smooth surface. The sphere is covered with the nitride film to protect the electronic device during the optical device process and to be used as a selective growth mask. It is desirable to form a film with small stress to cover the spherical surface. As the region for producing the optical device, this embodiment uses plane (111) in the southern hemisphere and planes associated therewith (four planes in total; (100), (010), (–100), (0–10)) 3301 (triangular plane of approximately 20 $\mu$m per side). FIG. 22 is a plan view of FIG. 21 viewed from the S-pole of the sphere. FIG. 23 is a sectional view of one of these planes. The entire surface may be covered with a nitride film, etc. again if necessary, and a window is made only in the region for producing the device. Since selective growth takes place according to the shape of the opening, this embodiment controls the opening so that it becomes cylindrical. Here, the (111) equivalent plane is selected for the following reasons.

(1) Because they are chemically equivalent to each other, it is possible to make a uniform structure in the subsequent crystal growth. (If another crystalline plane is included, anisotropy occurs in aspects of composition, film thickness and direction of crystal growth.
(2) In the plane contacting S-pole (in the light propagation direction), light is emitted in at least four directions or light is received from at least four directions. This is not limited to the (111) equivalent plane provided that other planes have an equivalent function or higher function.)

Crystal Growth

The structure of the device will be explained using FIG. 24. First, GaAs is stacked as a buffer layer 3501 on only a selected region (opening part) using a gas source MBE (molecular beam epitaxy) method or MOCVD (metal-organic chemical vapor deposition) method. Then, InGaAs is further stacked while changing gradually the In composition so that it provides lattice matching with $In_{0.1}Ga_{0.9}As$. After this, the n-InAlGaAs clad layer 3502, GaInNAs/InAlGaAsMQW (Multiple Quantum Well) active layer (light emitting wavelength: 1.3 $\mu$m) 3503, p-InAlGaAs clad layer 3504 and p-InGaAs contact layer 3505 are stacked one after another. Since in this crystal growth process the elements belonging to the III–V groups of the periodic table are stacked on each other, it is characterized in that it is easier than the staking the elements belonging to the III–V groups on Si in Embodiment 8. Then, a positive electrode 3506 is formed after a light input/output window 3507 is attached. Then, a negative electrode is formed from inside the sphere at a desired position, unnecessary nitride films are removed, wires are connected to the IC electrodes, and in this way this embodiment is completed.

Mounting

A mounting example is shown in FIG. 25. In FIG. 25, reference numeral 3601 denotes a substrate made of PMMA, etc., and 3602 denotes the optical waveguide core layer made of polyimide, etc. formed thereon. On top of this, a clad layer 3603 such as of PMMA is further formed. A cavity is formed on this clad layer 3603 and core layer 3602 using photolithography, etc. so that the above-described spherical optoelectronic device can fit therein. After this, the device is fixed with UV-hardened resin, etc. (not shown). Then, contact with the printed wiring 3501 is made using the Au bump 3502.

Principle of Operation

An operation of this embodiment as a light receiving device is the same as the case with the above-described embodiment. That is, by applying a reverse bias to the optical device, the light incident upon the incident light window from a wide range of angles is absorbed by the pn junction and taken in as an electric signal by an adjacent electronic device. Since Ga(In)NAs has a smaller band gap than GaAs, Ga(In)NAs operates on a lower voltage than GaAs. Furthermore, Ga(In)NAs has a greater mobility than Si, and can therefore respond fast.

Since Ga(In)NAs is a direct transition type compound semiconductor, it can also be used as a light emitting element. When Ga(In)NAs is operated as a light emitting element, by applying a forward bias to the drive electrode of the light emitting element in FIG. 20 or FIG. 22, the light emitted from the pn junction is emitted from the light emitting window in a wide range of angles. This may be driven by the logic data itself or driven through a driver circuit. Since the surface of both the light emitting device and light receiving device is spherical, this embodiment has a major feature of being capable of emitting and receiving light in a wide range of angles.

Effects

This embodiment has the following effects.

(1) It is possible to receive light with a longer wavelength than GaAs.

When a light source with a 0.85 µm band is used, Si-pin PD of Embodiment 1 may not have sufficient light receiving sensitivity. This embodiment has no such a possibility. This also reduces burden on the electric circuit.

(2) CMOS cannot be used, but an FET or GaAs bipolar circuit can be used instead, and is therefore advantageous in high-speed processing.
(3) By using high-speed processing capability, it is possible to convert parallel data to serial data and then transfer.
(4) In this structure, GaAsN is a direct transition type, and therefore can also be used as a light emitting element.

This embodiment uses a spherical GaAs substrate, but this embodiment is not limited to this substrate.

Embodiment 10: III–VN on Spherical InP Substrate

Using a spherical InP substrate for the substrate makes it possible to obtain other effects.

This embodiment will be explained using FIG. 24 again.

Production of Ball IC

As shown in FIG. 21, an IC 3102 is produced on the hemispherical surface (here, northern hemisphere) of the undoped spherical InP substrate (1 mm) 3101. This IC may be a drive IC or parallel-serial conversion circuit in the case of a light emitting element, and the IC may be a bias circuit, preamp, waveform shaping circuit or serial-parallel conversion circuit in the case of a light receiving element. Of course, when the IC is used for both functions, appropriate electronic circuits need to be added. These circuits can be made through a normal FET or Bipolar process. Since it has a smaller band gap and a higher mobility compared with GaAs, it is possible to use a high-speed driver circuit.

Production of Optical Device

After the InP ball IC process is almost completed, an optical device is produced. First, the entire sphere is covered with a nitride film, etc. and the region where the optical device is made is ground and polished to form a smooth surface. The sphere is covered with the nitride film in order to protect the electronic device during the optical device process and to be used as a selective growth mask. It is desirable to form a film with small stress to cover the spherical surface. As the region for producing the optical device, this embodiment uses plane (111) in the southern hemisphere and planes associated therewith (four planes in total; (100), (010), (−100), (0−10)) 3301 (triangular plane of approximately 20 µm per side). FIG. 22 is a plan view of FIG. 21 viewed from the S-pole direction. FIG. 23 is a sectional view of one of these planes. The entire surface may be covered with a nitride film, etc. again if necessary and a window is made only in the region for producing the device. Since selective growth takes place according to the shape of the opening, this embodiment controls the opening so that it becomes cylindrical. Here, the (111) equivalent plane is selected for the following reasons.

(1) Because they are chemically equivalent to each other, it is possible to make a uniform structure in the subsequent crystal growth. (If another crystalline plane is included, anisotropy occurs in aspects of composition, film thickness and direction of crystal growth.)
(2) In the plane contacting S-pole (in the light propagation direction), it is possible to emit light in at least four directions or receive light from at least four directions. This is not limited to the (111) equivalent plane provided that other planes have an equivalent function or higher function.)

Crystal Growth

The structure of the device will be explained using FIG. 24. First, InP is stacked as a buffer layer 3501 on only a selected region (opening part) using a gas source MBE (molecular beam epitaxy) method or MOCVD (metal-organic chemical vapor deposition) method. Then, InGaP is further stacked thereon while changing gradually the In composition so that it provides lattice matching with $In_{0.9}Ga_{0.1}P$. After this, the n-InAlGaP clad layer 3502, GaInNP/InAlGaPMQW (Multiple Quantum Well) active layer (light emitting wavelength: 1.5 µm) 3503, p-InAlGaP clad layer 3504 and p-InGaP contact layer 3505 are stacked one after another. After the light input/output window 3507 is attached, a positive electrode 3506 is formed. Then, a negative electrode is formed from inside the sphere at a desired position, unnecessary nitride films are removed, wires are connected to the IC electrodes, and in this way this embodiment is completed.

Mounting

A mounting example is shown in FIG. 25. In FIG. 25, reference numeral 3601 denotes a substrate made of PMMA, etc., and 3602 denotes the optical waveguide core layer made of polyimide, etc. formed thereon. On top of this, a clad layer 3603 such as of PMMA is further formed. A cavity is formed on this clad layer 3603 and core layer 3602 using photolithography, etc. so that the above-described spherical optoelectronic device can fit therein. After this, the device is fixed with UV-hardened resin, etc. (not shown). Then, contact with the printed wiring substrate 3605 is made using the Au bump 3606. The reference numeral 3604 denotes an electrode.

Principle of Operation

In the case of an operation as a light receiving device, by applying a reverse bias to the optical device, the light incident upon the incident light window from a wide range of angles is absorbed by the pn junction and taken in as an electric signal by an adjacent electronic device. Since InGaPN has a smaller band gap than InP, InGaPN operates on a lower voltage than InP. Furthermore, InGaPN has a greater mobility speed than Si, and can therefore respond fast. Since InGaPN is a direct transition type compound semiconductor, it can also be used as a light emitting element. When InGaPN is operated as a light emitting element, by applying a forward bias to the optical device in FIG. 20 or FIG. 22, the light emitted from the pn junction is emitted from the light emitting window in a wide range of angles. This may be driven by the logic data itself or driven through a driver circuit. The surfaces of both the light emitting device and light receiving device are spherical, this embodiment has a major feature of being capable of emitting and receiving light in a wide range of angles.

Effects

This embodiment has the following effects.

(1) Use of a small band gap has smaller burden on the electric circuit.
(2) It is possible to produce a faster circuit than Si or GaAs.
(3) Because 1.5 $\mu$m band light can be used, it is possible to directly couple with a low loss fiber without any relay circuit and carry out long-distance high-speed transmission.

Embodiment 11: III–VN on GaN Substrate

Using a spherical GaN substrate for the substrate makes it possible to obtain other effects.

This embodiment will be explained using FIG. 24 and others again.

Production of Ball IC

As shown in FIG. 21, an IC 3102 is formed on the hemispherical surface (here, northern hemisphere) of the undoped spherical GaN substrate (1 mm) 3101. This IC may be a drive IC or parallel-serial conversion circuit in the case of a light emitting element, and the IC may be a bias circuit, preamp, waveform shaping circuit or serial-parallel conversion circuit in the case of a light receiving element. Of course, when the IC is used for both functions, appropriate electronic circuits need to be added. These circuits can be made by combining a normal FET or Bipolar process (e.g., S. C. Binari, K. Doverspike, G. Kelner H. B. Dietrich, and A. F. Wickenden; Solid State Electronics, 41(1997). p. 97 or S. Yoshida and J. Suzuki; Journal of Applied Physics Letters, 85 (1999). p. 7931, etc.) and spherical Si process (see Embodiment 8. Since its band gap is by far larger than Si, and has therefore performance indices different from Si and other III–V materials such as capability of high temperature, high voltage and high frequency operations.

Production of Optical Device

After the GaN ball IC process is almost completed, an optical device is produced. First, the entire sphere is covered with a nitride film (SiN, etc.) and the region where the optical device is made is ground and polished to form a smooth surface. The sphere is covered with the nitride film in order to protect the electronic device during the optical device process and to be used as a selective growth mask. It is desirable to form a film with small stress to cover the spherical surface. As the region for producing the optical device, this embodiment uses plane (111) in the southern hemisphere and planes associated therewith (four planes in total; (100), (010), (-100), (0-10)) 3301 (triangular plane of approximately 20 $\mu$m per side). FIG. 22 is a plan view of FIG. 21 viewed from the S-pole direction. FIG. 23 is a sectional view of one of these planes. The entire surface may be covered with a nitride film, etc. again if necessary and a window is made only in the region for producing the device. Since selective growth takes place according to the shape of the opening, this embodiment controls the opening so that it becomes cylindrical. Here, the (111) equivalent plane is selected for the following reasons.

(1) Because they are chemically equivalent to each other, it is possible to make a uniform structure in the subsequent crystal growth. (If another crystalline plane is included, anisotropy occurs in aspects of composition, film thickness and direction of crystal growth.)

(2) In the plane contacting S-pole (in the light propagation direction), it is possible to emit light in at least four directions or receive light from at least four directions. This is not limited to the (111) equivalent plane provided that other planes have an equivalent function or higher function.)

Crystal Growth

The structure of the device will be explained using FIG. 24. First, GaN is stacked as a buffer layer 3501 on only a selected region (opening part) using a gas source MBE (molecular beam epitaxy) method or MOCVD (metal-organic chemical vapor deposition) method. Then, the n-AlGaN clad layer 3502, GaInN/AlGaNMQW (Multiple Quantum Well) active layer (light emitting wavelength: 0.4 $\mu$m) 3503, p-AlGaN clad layer 3504 and p-GaN contact layer 3505 are stacked one after another. After the light input/output window 3507 is attached, a positive electrode 3506 is formed. Then, a negative electrode is formed from inside the sphere at a desired position, unnecessary nitride films are removed, wires are connected to the IC electrodes, and in this way this embodiment is completed.

Mounting

A mounting example is shown in FIG. 25. In FIG. 25, reference numeral 3601 denotes a substrate such as of PMMA and 3602 denotes the optical waveguide core layer made of polyimide, etc. formed thereon. On top of this, a clad layer 3603 such as of PMMA is further formed. A cavity is formed on this clad layer 3603 and core layer 3602 using photolithography, etc. so that the above-described spherical optoelectronic device can fit therein. After this, the device is fixed with UV-hardened resin, etc. (not shown). Then, contact with the printed wiring 3605 is made using the Au bump 3606.

Principle of Operation

In the case of an operation as a light receiving device, it is completely carried out in the same manner as in the case of Embodiment 8. That is, by applying a reverse bias to the optical device, the light incident upon the incident light window from a wide range of angles is absorbed by the pn junction and taken in as an electric signal by an adjacent electronic device. Since GaN has a much smaller band gap than Si, GaAs or InP, GaN requires a high voltage. On the other hand, it has an advantage that it is capable of high temperature operation for both the electronic device and optical device. When GaN is operated as a light emitting element, by applying a forward bias to the optical device in FIG. 20 or FIG. 22, the light emitted from the pn junction is emitted from the light emitting window in a wide range of angles. This may be driven by the logic data itself or driven through a driver circuit.

Since the surfaces of both the light emitting device and light receiving device are spherical, this embodiment has a major feature of being capable of emitting and receiving light in a wide range of angles.

This embodiment has the following effects.

(1) Because of a large band gap, it is possible to operate at a high temperature.
(2) High voltage operation can be carried out compared with Si and GaAs.
(3) Because 0.4 $\mu$m band light can be used, ON/OFF can be confirmed by naked eyes.

Embodiment 12: Single Layer Electric Wiring Layer+ Optical Wiring Layer+Photonic Ball IC FIG. 26 is a schematic view for illustrating another embodiment of the present invention.

Figure 26:
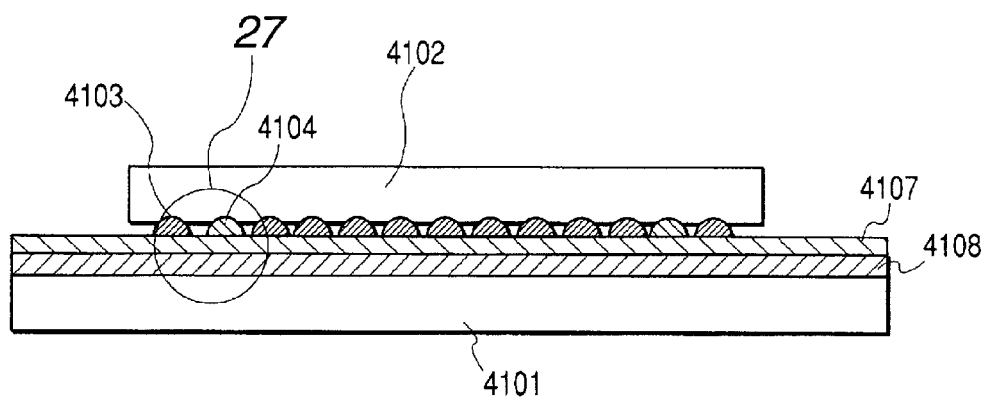
FIG. 26 is a schematic sectional view illustrating the present invention.

In FIG. 26, reference numeral 4101 denotes a support substrate; 4107 and 4108, an optical wiring layer and electric wiring layer formed thereupon. Reference numeral 4102 denotes an IC chip mounted on an electric wiring layer 4107.

Figure 27:
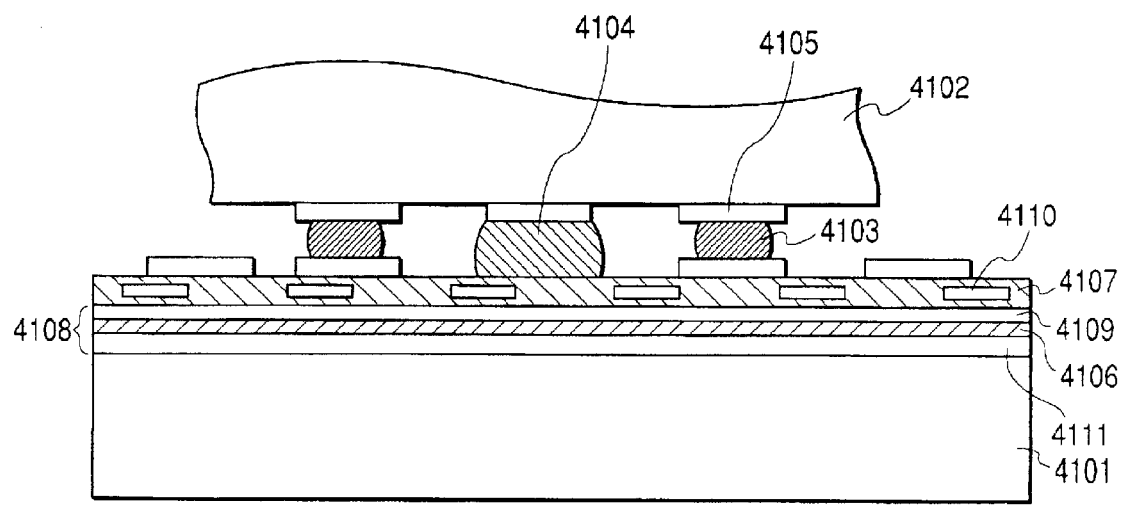
FIG. 27 is a schematic sectional view illustrating the present invention.

FIG. 27 is an enlarged view of the portion 27 of FIG. 26 and reference numeral 4103 denotes a bump for mounting the IC 4102 (e.g., ball solder); 4104 a photonic ball; 4105, an electrode pad for electrically connecting these components. 4106 and 4109 denote a two-dimensional optical waveguide (hereinafter referred to as "optical film") and clad layer that make up an optical wiring layer 4108. This configuration is referred to as a "optoelectronic substrate".

In this embodiment, when the IC chip 4102 is connected to an electric wiring layer 4107, a plurality of metal bumps are used (FIG. 26). A part of the metal bumps is replaced with photonic ball ICs 4104 of almost the same size. A part of photonic ball ICs 4104 are embedded in the optical wiring layer 4108.

When the optical wiring layer 4108 is formed, it is set that the substrate 4111 is 0.5 mm thick, the core layer 4106 is 0.1 mm thick and the clad layer 4109 is 0.3 mm thick, but they are not limited to these sizes. The clad layer may be omitted.

For the electric wiring layer 4107, it is possible to use a thermal fusion type resin material (0.3 mm thick) with a built-in single-layer Cu micro strip line 4110.

Photonic Ball IC

One of the features of the present invention is that the IC chip is mounted on the optoelectronic board through an EO or OE device.

Then, the photonic ball IC, which is an example of this EO or OE device, will be explained in short below (its production method is described, for example, in Japanese Patent Application Laid-Open No. 2001-284635).

Figure 28:
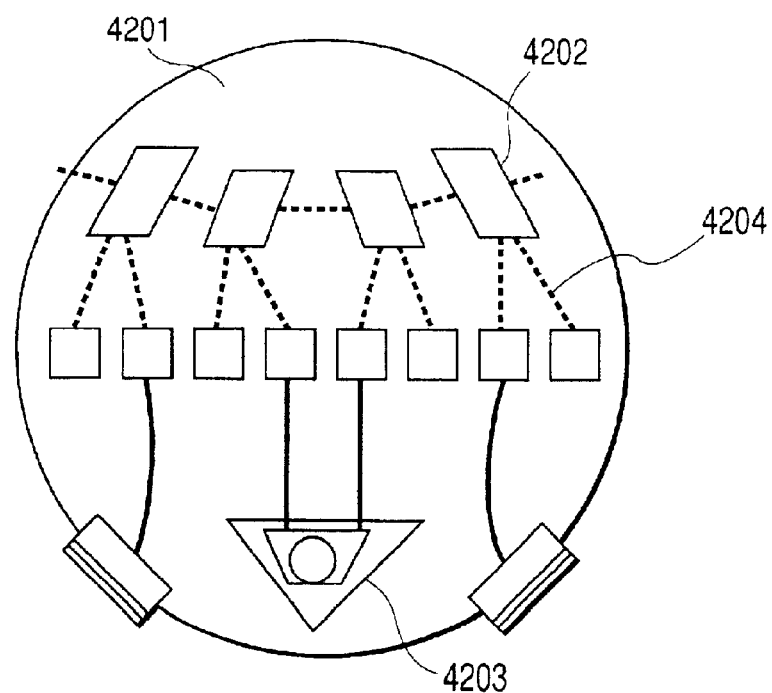
FIG. 28 is a schematic view illustrating the present invention.

In FIG. 28, reference numeral 4201 denotes an undoped spherical Si substrate (e.g., 1 mm): 4202, an IC formed on the hemispherical surface (here, northern hemispherical surface). Reference numeral 4203 denotes an optical device such as a light emitting element or light receiving element formed on the southern hemispherical surface there, it is possible to use a GaInNAs AlGaAs-based planar light emitting laser or planar photodiode formed or the four planes equivalent to (111)). Reference numeral 4204 denotes an electric wire.

When integrated with the light emitting element 4203, the IC 4202 may be a drive IC or parallel-serial conversion circuit. When integrated with the light receiving element 4203, the IC 4202 may be a bias circuit, preamp, waveform shaping circuit or serial-parallel conversion circuit. Of course, when the IC is used for both functions, appropriate electronic circuits need to be added. These circuits can be made through a normal CMOS process and its logic voltage is 3.3 V.

Figure 29:
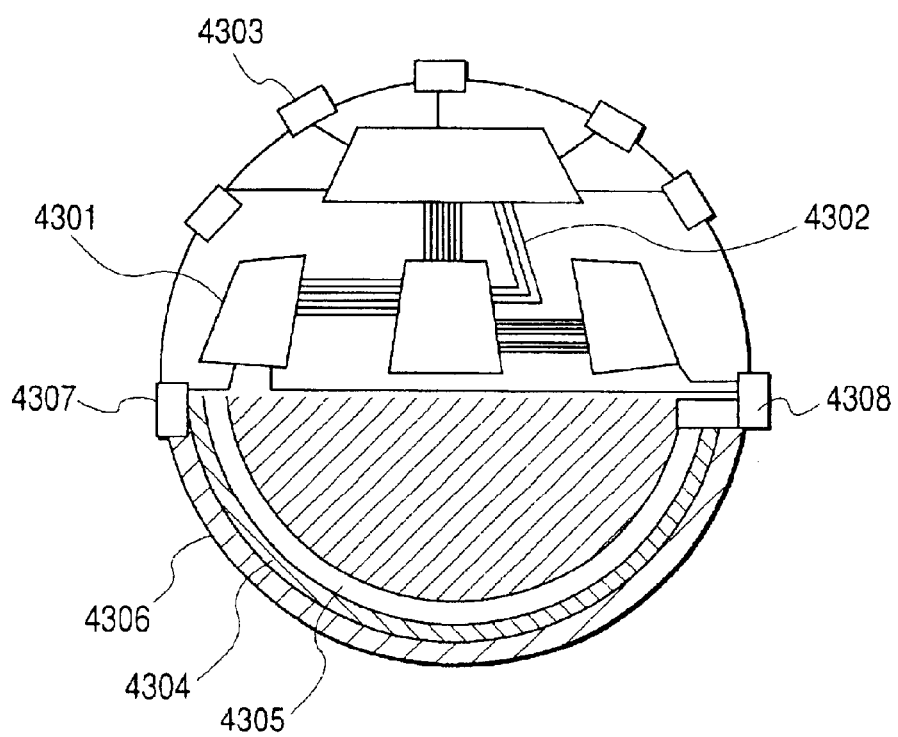
FIG. 29 is a schematic view illustrating the present invention.

FIG. 29 shows another mode of the photonic ball IC. In FIG. 29, the electronic circuit is the same as above, but the optical device is very different. Reference numeral 4305 is a hemispherical active layer and in the case of a light emitting device, carriers injected from the optical device electrode 4307 re-couple and emit light. In the case of a light receiving device, a reverse bias is applied to the active layer 4305 and the received light forms an electron-hole pair. The active layer 4305 is spherical in both cases, and therefore it is possible to perform EO or OE conversion with high efficiency without preparing any special optical system.

Mounting Photonic IC on Optoelectronic Board

Then, the method of mounting this spherical optical device will be explained. First, a hemispherical cavity is made on the surface of the optoelectronic board (the electric wiring layer 4107 in this embodiment) to allow the above-described photonic ball IC to fit therein.

The method of making the cavity is the same as that described above.

Then, the optical device is mounted in the cavity of the optical sheet in such a way that the optical device comes to the bottom side. To allow light to be taken in or out, the optical device is positioned and fixed in such a way that the optical I/O section touches the bottom of the cavity (see FIG. 30). After the positioning, the optical device can be fixed with UV-hardened resin, etc.

Figure 30:
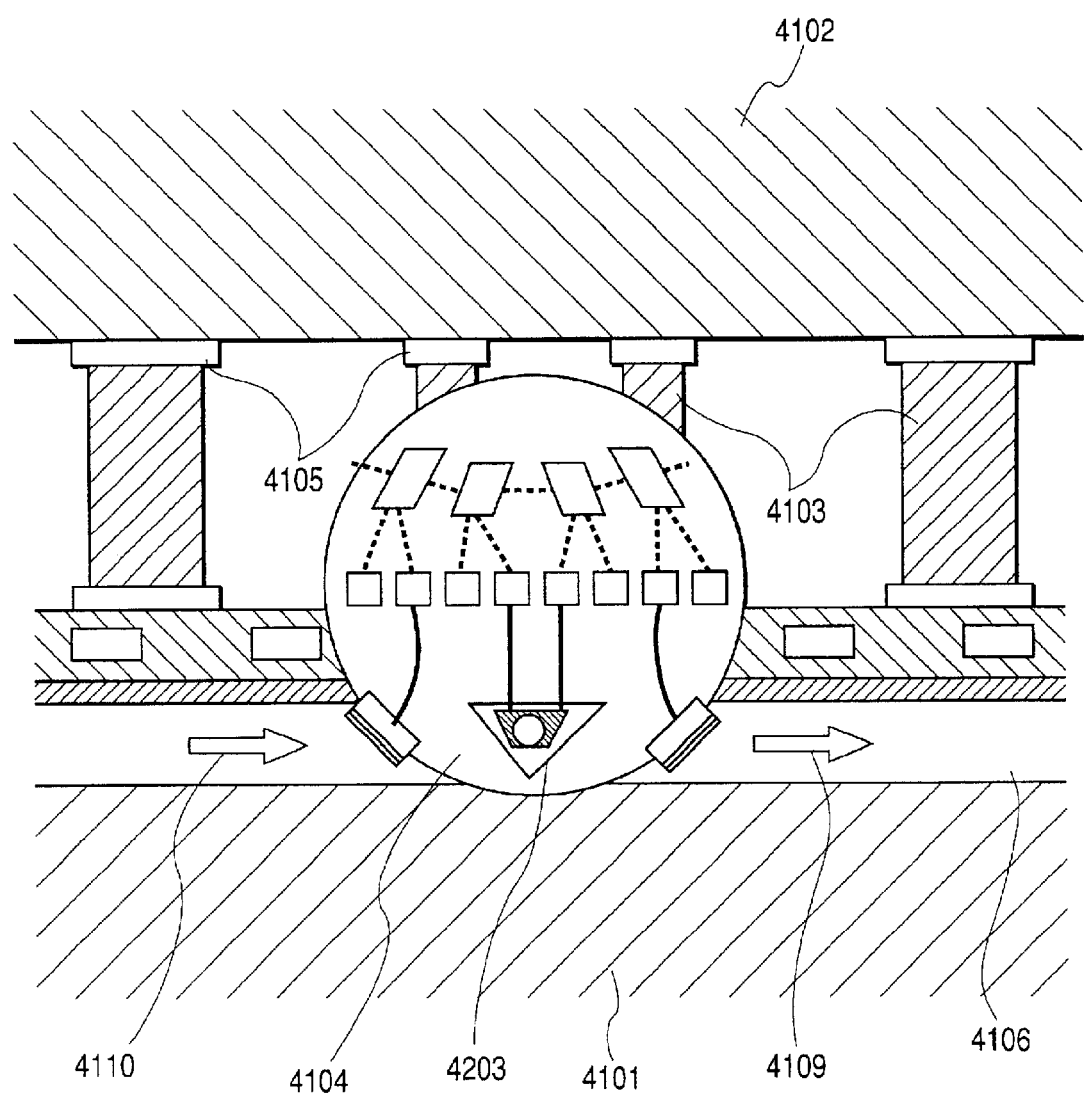
FIG. 30 is a schematic view illustrating the present invention.

Then, electrical connections are made using a flip chip mounting method. In FIG. 30, reference numeral 4103 denotes a bump and 4105 denotes an electrode pad. The bump is placed on the electrode pad 4105 on the IC side, the above-described photonic ball IC 4104 is positioned with the substrate, the bump is melted by reflow and then cooled down, thus making it possible to obtain an electrical contact all at once.

Thus, performing flip chip mounting and photonic ball IC mounting simultaneously not only simplifies processes but also increases mechanical strength of the photonic ball IC.

Here, the bump is assumed to be rectangular but it is not necessary to stick to this form. Finally, the gap between the IC chip and optoelectronic board is filled with a refilling material, etc. (not shown), which creates a more stable mounting condition. Of course, it is also possible to mount BGA (Ball Grid Array) on the bump using ball solder.

Principle of Operation

Then, the principle of operation will be explained.

Transmission Function

In FIG. 30, the electrode pad 4105 of the LSI 4102 can send or receive a signal to or from adjacent electronic devices via the bump 4104. The LSI logic signal (e.g., 3.3 V in the case of CMOS) is a voltage enough to directly drive the above-described spherical optical device.

Applying a logic signal, which constitutes a forward bias, to a light emitting device (e.g., LED) on the photonic ball IC 4104 causes the electric signal to convert to an optical signal (when power is required or when a predetermined bias voltage should be applied, a driver circuit or bias may be built in on the photonic ball IC). The emitted light is output to the core layer 4106 and spreads and propagates over the entire optical sheet as the output light 4109 without any special optical system. If the size of the substrate is about 30 mm per side and propagation loss is 0.3 dB/cm or less, light output of about 1 mW is enough to obtain reception input necessary for minimum reception sensitivity.

Reception Function

On the contrary, when the input optical signal 4110 that propagates through the optical wiring layer (optical film) 4108 in an arbitrary direction reaches the surface of the light receiving element 4102 of the photonic ball IC, it is taken in, absorbed near a reverse-biased pn junction and converted to an electronic signal. The converted electric signal is taken in the adjacent LSI 4102 as an input electronic signal and processed by the adjacent LSI 4102.

Electric Parallel/Optical Serial Transmission

Figure 31:
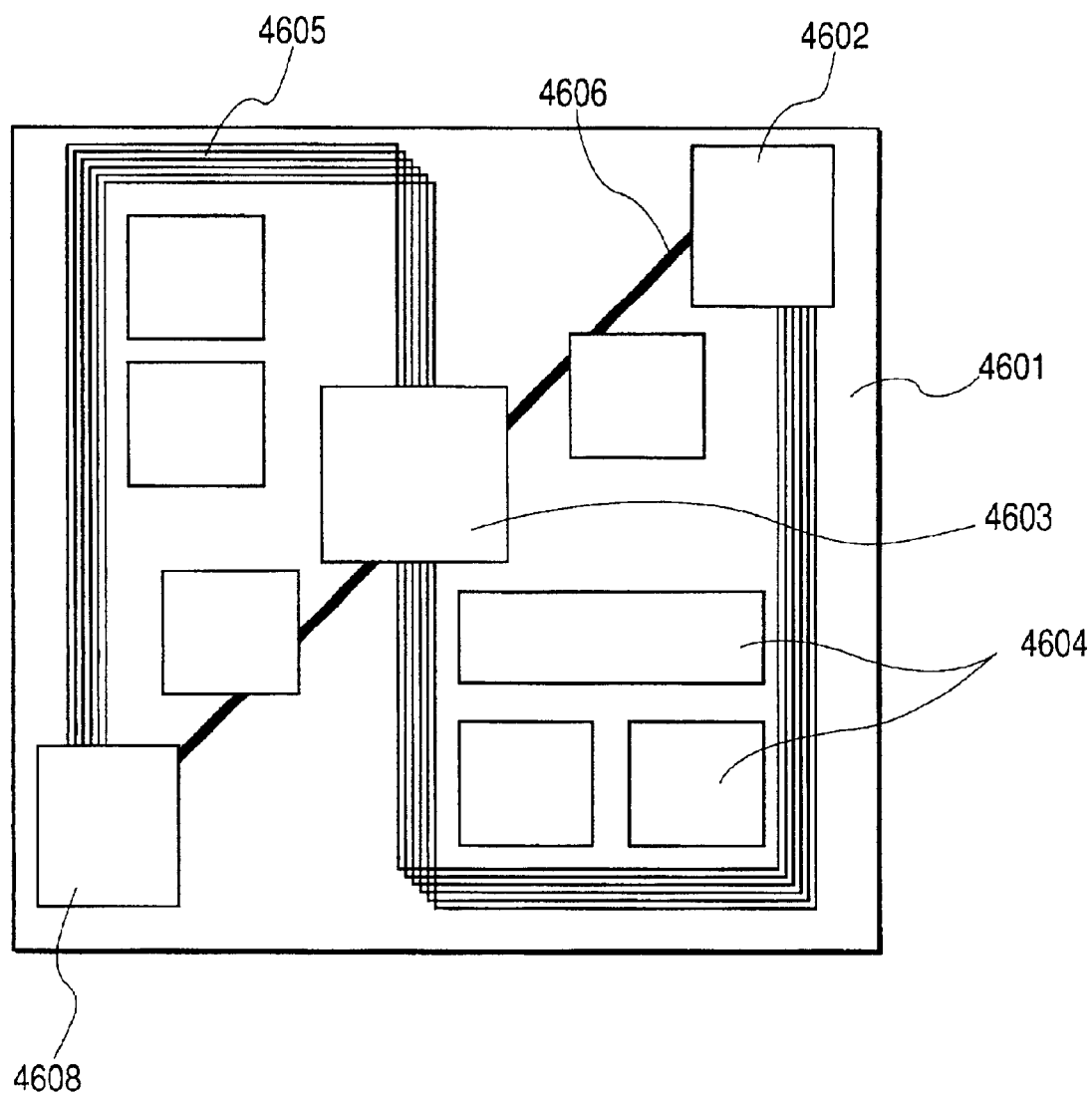
FIG. 31 is a schematic top view illustrating the present invention.

Electric parallel/optical serial transmission will be explained using FIG. 31. In FIG. 31, reference numeral 4601 denotes an optoelectronic board; 4602 and 4608, CPUs; 4603, a RAM shared by these two CPUs; 4604, other devices; 4605, electric wiring; 4606, optical wiring.

Normal electric wiring requires, for example, 64-bit data lines with 6 transmission paths. There is no problem with low-speed data processing, whereas an application involving large-volume and high-speed data transfer (moving images, etc.) is susceptible to influences from operations of other devices mounted on the substrate or influences of EMI. It is extremely difficult for conventional wiring to constantly send stable data. Optical wiring is used only for such an application.

For example, in FIG. 31, 6 electric wires are necessary to send 64-bit data from the CPU 4602 to RAM 4603, but if parallel-serial conversion is performed at the final stage of the CPU and one optical I/O element is connected, an electric signal is sent as an optical signal through the optical waveguide section of the optoelectronic board, received by the optical I/O element on the receiving side and serial-parallel converted into a 64-bit parallel signal. The parallel-serial conversion increases the clock but there is no problem of EMI because the signal propagates through the optical waveguide.

Use of a flip chip mounting or BGA method as the mounting method provides an easy way of mounting without applying an additional mounting method for optical wiring. The BGA (Ball Grid Array) method is a method of connecting an IC electrode pad and substrate electrode pad in array form using solder called "bump" and has excellent characteristics such as faster operation, smaller area occupied and lower resistance compared to conventional wire bonding.

Typical sizes of BGA pitch and ball solder are about 1 mm and 0.50 mm respectively. That is, if the above-described photonic ball IC is 1 mm or below, it is possible to use a normal BGA process.

The photonic ball IC consists of an electronic device and optical device integrated on a spherical semiconductor substrate (usually spherical Si substrate), and this photonic ball IC alone can perform OE/EO conversions. Using a photonic ball IC that can be directly driven with the voltage of a logic signal from an LSI on the optoelectronic board requires no special additional circuit. Because it is spherical, the photonic ball IC can also be optically coupled with the optical film section of the above-described optoelectronic board without requiring any special optical system.

Figure 32:
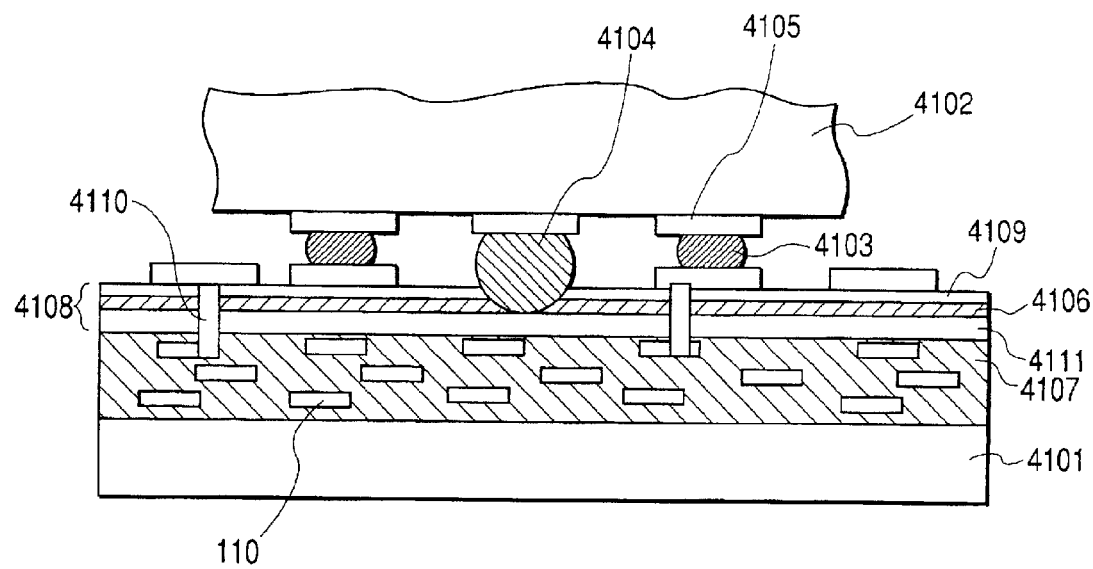
FIG. 32 is a schematic sectional view illustrating the present invention.

Embodiment 13: Changing Sequence of Electric Wiring Layer and Optical Wiring Layer FIG. 32 is a schematic view for illustrating another embodiment of the present invention. This embodiment differs from Embodiment 12 in that the electric wiring layer consists of multiple layers and the optical wiring layer is stacked thereon.

In FIG. 32, reference numeral 4107 denotes an electric wiring layer containing multi-layer internal wiring 110, and reference numeral 4108 denotes an optical wiring layer (optical film) composed of the core layer 4106 and clad layers 4109 and 4111.

On the outermost surface of the optical wiring layer, an electrode pad 4105 and wiring pattern (not shown) are arranged, and the electric wiring layer 4107 is coupled through a via hole 4110. This via hole penetrates the optical wiring layer and since light propagates two-dimensionally, there is little influence unless the via is densely formed.

An effect specific to this embodiment is that the optical wiring layer can be placed independently of the thickness of the electric wiring layer.

Embodiment 14: Inserting Two Optical Sheets in a Multi-layer PCB Substrate

Figure 33:
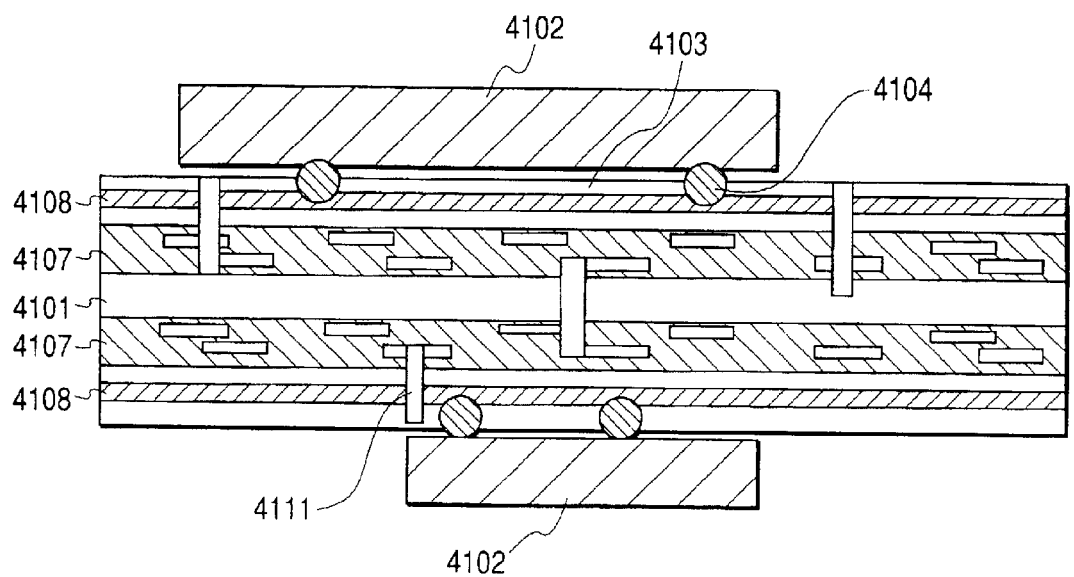
FIG. 33 is a schematic sectional view illustrating the present invention.

FIG. 33 is a schematic view for illustrating another embodiment of the present invention. This embodiment differs from Embodiment 12 in that not only an electric wiring layer but also an optical film are formed on both sides.

In FIG. 33, reference numeral 4101 is a support substrate and the structure in Embodiment 13 is formed on both sides of the support substrate. Furthermore, forming a via hole 4111 that penetrates the support substrate 4101 allows both sides to be electrically connected. Other processes are the same as those in Embodiment 12 or Embodiment 13.

As a special case, the support substrate 4101 may be removed.

Figure 34:
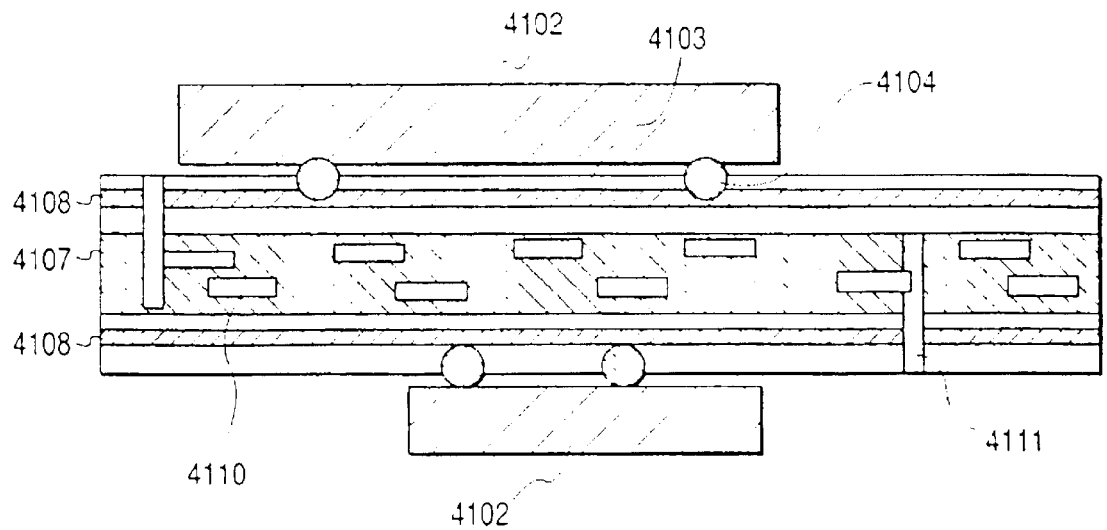
FIG. 34 is a schematic sectional view illustrating the present invention.

FIG. 34 is a schematic view illustrating this embodiment.

The optoelectronic board consists of a pair of optical wiring layers (4108) and one multi-layer wiring layer (4107). Use of flexible materials for both the multi-layer wiring layer and optical wiring layer provides an optoelectronic flexible board.

Features of this configuration are not only that the mounting area can be increased but also that it is possible to provide EMI-free optical wiring using an optical film in such a situation that wires in the multi-layer wiring layer are close to each other and EMI is not negligible, and that removing the support substrate provides a more flexible substrate. For example, it is also possible to bend the substrate itself 90 degrees and mount it.

As described above, the present invention can provide a semiconductor device having reduced direction dependency when light propagating through the optical transmission region (optical sheet) is received.

What is claimed is:

1. A semiconductor device in a printed board comprising:
   an optical transmission region for transmitting a light signal; and
   a light emitting part; and
   a light receiving part for converting the light signal propagating through the optical transmission region to an electrical signal,
   wherein the optical transmission region comprises a two-dimensional optical waveguide layer capable of propagating the light signal in a plurality of directions,
   wherein at least a portion of the light receiving part is embedded in the optical transmission region such that the light receiving part can receive the light signal propagating within a plane of the two-dimensional optical waveguide layer, and
   wherein the at least a portion of the light receiving part has a spherical surface.

2. The semiconductor device according to claim 1, wherein an electric wiring layer is stacked on the optical transmission region.

3. The semiconductor device according to claim 1, wherein the at least a portion of the light receiving part is embedded in the optical transmission region such that the light receiving part can directly receive the light signal propagating through the two-dimensional optical waveguide layer.

4. The semiconductor device according to claim 1, wherein the light receiving part includes a spherical device.

5. The semiconductor device according to claim 1, wherein the light emitting part is for transmitting the light signal to the optical transmission region, and wherein at least a portion of the light emitting part is embedded in the optical transmission region.

6. The semiconductor device according to claim 2, wherein the optical transmission region is interposed between the electric wiring layer located on the optical transmission region and another electric wiring layer located under the optical transmission region, and wherein at least a portion of the electric wiring layer is electrically connected to at least a portion of the another electric wiring layer by a via hole for penetrating the optical transmission region.

7. The semiconductor device according to claim 2, wherein at least one of O/E conversion or E/O conversion between an electronic device provided on the electric wiring layer and the optical transmission region is performed using a spherical device.

8. An optoelectronic printed board comprising:

a substrate comprising at least a first layer and a second layer, the first layer including an electronic device, an optical device, a light emitting device, and an electric wiring for coupling the electric device and the optical device, and the second layer including a two-dimensional optical waveguide capable of propagating a light signal in a plurality of directions, wherein the optical device comprises a light receiving part for receiving the light signal waveguided through the two-dimensional optical waveguide, wherein at least a portion of the light receiving part is embedded in the two-dimensional optical waveguide such that the light receiving part can receive the light signal propagating within a plane of the two-dimensional optical waveguide, and wherein the light receiving part has a spherical structure, the light receiving part is mounted from a surface of the substrate such that the at least a portion of the light receiving part is embedded in the two-dimensional optical waveguide, and the light receiving part is coupled, on the surface of the substrate, with the electric wiring.

9. The optoelectronic printed board according to claim 8, wherein the two-dimensional optical waveguide has a sheet-shaped form.

10. The optoelectronic printed board according to claim 8, wherein the optical device is provided with an electric circuit for driving the light receiving part or amplifying an electric signal obtained.

11. The optoelectronic printed board according to claim 8, wherein a light source of the optical device has a spherical shape, the light source is mounted on the substrate from a surface of the substrate such that at least a portion of the light source is embedded in the two-dimensional optical waveguide of the substrate, and the light source is coupled, on the surface of the substrate, with the electric wiring.

12. The optoelectronic printed board according to claim 8, the substrate further comprising: a transmission device for transmission having a spherical structure; and a parallel signal line, wherein an output terminal of the parallel signal line is coupled with the transmission device for transmission, and wherein the transmission device for transmission conducts parallel/serial conversion and sends a serial optical signal to the two-dimensional optical waveguide.

13. The optoelectronic printed board according to claim 12, wherein the serial optical signal is received by the light receiving part, converted to an electric signal, subjected to serial/parallel conversion by an electronic circuit simultaneously formed on the light receiving part, and transmitted to the parallel signal line.

14. The optoelectronic printed board according to claim 8, wherein the optoelectronic printed board is made of a flexible substrate material.

15. An optoelectronic integrated circuit comprising:

an electronic device and optical device integrated on a surface of a spherical semiconductor substrate, wherein the optical device is a light receiving element that includes a multi-layer film containing a pn junction, and wherein the electronic device includes at least a bias circuit for applying a reverse bias to the light receiving element, and an amplifier for amplifying a signal obtained by converting a received light to an electric signal.

16. The optoelectronic integrated circuit according to claim 15, wherein at least a portion of the light receiving element is embedded in an optical transmission medium.

17. The optoelectronic integrated circuit according to claim 15, wherein the spherical semiconductor substrate is made of an Si single crystal.

18. The optoelectronic integrated circuit according to claim 15, wherein the spherical semiconductor substrate is made of a GaAs single crystal.

19. The optoelectronic integrated circuit according to claim 15, wherein the multi-layer film of the light receiving element is made of p-Si, i-Si and n-Si.

20. The optoelectronic integrated circuit according to claim 15, wherein the multi-layer film of the light receiving element is made of p-GaAs, GaAsN and n-GaAs.

21. A method of producing the optoelectronic integrated circuit according to claim 15, which comprises forming the multi-layer film of the light receiving element by ion implantation.

22. An optoelectronic integrated circuit comprising:

an electronic device and optical device integrated on a surface of a spherical semiconductor substrate, wherein the optical device is a light emitting element that includes a multi-layer film containing a pn junction in a radial direction of the spherical semiconductor substrate, and wherein the electronic device comprises a bias circuit that applies a forward bias to the light emitting element.

23. The optoelectronic integrated circuit according to claim 22, wherein at least a portion of the light emitting element is embedded in an optical transmission medium.

* * * * *

UNITED STATES PATENT AND TRADEMARK OFFICE
CERTIFICATE OF CORRECTION

PATENT NO. : 6,897,430 B2
APPLICATION NO. : 10/025928
DATED : May 24, 2005
INVENTOR(S) : Mamoru Uchida It is certified that error appears in the above-identified patent and that said Letters Patent is hereby corrected as shown below:

ON THE COVER PAGE
(56) References Cited, Other Publications, Line 8, "OKano," should read --Okano,--.

COLUMN 1
Line 44, "where in" should read --wherein--.

COLUMN 5
Line 54, "illustrates" should read --illustrating--.

COLUMN 11
Line 21, "12-31190" should read --2000-31190--; and
Line 51, "constitute" should read --constitutes--.

COLUMN 14
Line 45, "CPUS" should read --CPUs--; and
Line 48, "ring for" should read --for--.

COLUMN 15
Line 29, "illustrative" should read --illustrating--;
Line 38, "a optical" should read --an optical--; and
Line 58, "wiring, 2705;" should read --wiring; 2705,--.

COLUMN 16
Line 7, "a optical" should read --an optical--.

COLUMN 17
Line 33, "a optical" should read --an optical--.

COLUMN 19
Line 46, "1 mm)" should read --(1 mm)--.

COLUMN 20
Line 41, "the staking" should read --stacking--.

COLUMN 23
Line 32, "G. Kelner" should read --G. Kelner,--; and
Line 36, "Embodiment 8." should read --Embodiment 8).--.

UNITED STATES PATENT AND TRADEMARK OFFICE
CERTIFICATE OF CORRECTION

PATENT NO. : 6,897,430 B2
APPLICATION NO. : 10/025928
DATED : May 24, 2005
INVENTOR(S) : Mamoru Uchida It is certified that error appears in the above-identified patent and that said Letters Patent is hereby corrected as shown below:

COLUMN 25
Line 12, "as a" should read --as an--;
Line 39, "there," should read --(here,--; and
Line 40, "GaInNAs AlGaAs-based" should read --GaInNAs/AlGaAs-based--.

COLUMN 28
Line 28 (Claim 1, Line 3), "signal; and" should read --signal;--.

COLUMN 29
Line 10 (Claim 8, Line 5), "electric" should read --electronic--.

Signed and Sealed this

Fourteenth Day of August, 2007

JON W. DUDAS
*Director of the United States Patent and Trademark Office*